United States Patent
Djahanshahi et al.

(10) Patent No.: US 10,419,008 B2
(45) Date of Patent: Sep. 17, 2019

(54) SYSTEM AND METHOD FOR VOLTAGE-CONTROLLED OSCILLATOR CALIBRATION

(71) Applicant: Maxlinear Asia Singapore PTE LTD, Singapore (SG)

(72) Inventors: Hormoz Djahanshahi, Port Moody (CA); Masoud Ghoreishi Madiseh, Maple Ridge (CA)

(73) Assignee: MAXLINEAR ASIA SINGAPORE PTE. LTD., Singapore (SG)

( * ) Notice: Subject to any disclaimer, the term of this patent is extended or adjusted under 35 U.S.C. 154(b) by 188 days.

(21) Appl. No.: 15/470,375

(22) Filed: Mar. 27, 2017

(65) Prior Publication Data

US 2017/0331482 A1     Nov. 16, 2017

Related U.S. Application Data

(63) Continuation of application No. 15/234,743, filed on Aug. 11, 2016, now Pat. No. 9,608,647.
(Continued)

(51) Int. Cl.
    *H03L 7/099*     (2006.01)
    *H03B 1/00*     (2006.01)
    (Continued)

(52) U.S. Cl.
    CPC .............. *H03L 7/099* (2013.01); *H03B 1/00* (2013.01); *H03B 5/04* (2013.01); *H03B 5/08* (2013.01);
    (Continued)

(58) Field of Classification Search
    CPC ......... H03L 7/099; H03L 1/026; H03L 7/087; H03L 7/113; H03L 7/18; H03B 5/1212; H03B 5/124; H03B 1/00; H03B 5/00; H03B 5/08; H03B 5/1243; H03B 5/04; H03B 5/1265; H03B 5/1293
(Continued)

(56) References Cited

U.S. PATENT DOCUMENTS

| | | | |
|---|---|---|---|
| 7,969,248 B1 * | 6/2011 | Whitten | H03L 7/113 331/16 |
| 8,531,245 B2 | 9/2013 | Joubert et al. | |
| 9,344,094 B2 * | 5/2016 | Waldrip | H03L 1/022 |

* cited by examiner

*Primary Examiner* — Arnold M Kinkead
(74) *Attorney, Agent, or Firm* — McAndrews, Held & Malloy, Ltd.

(57) ABSTRACT

Methods and systems are provided for calibrating voltage-controlled oscillators (VCOs). frequency control information, relating to output frequency of a VCO, which varies based on changes in operational conditions, may be determined. The frequency control information enables indicating the output frequency within a range of allowable values for control inputs and a range of expected values based on the operational conditions. For each control input setting, calibration control information for a calibration voltage associated with a control input, may be determined, based on the frequency control information, with respect to the operational conditions, to generate a constant output frequency. The operational conditions may be assessed, and a calibration voltage corresponding to the assessed operational conditions may be determined. The calibration voltage may be applied, and based on applying the calibration voltage, a tuning control input for tuning the constant output frequency may be determined and applied to the VCO.

20 Claims, 18 Drawing Sheets

Related U.S. Application Data

(60) Provisional application No. 62/232,688, filed on Sep. 25, 2015.

(51) Int. Cl.
*H03L 1/02* (2006.01)
*H03B 5/12* (2006.01)
*H03B 5/08* (2006.01)
*H03B 5/04* (2006.01)
*H03L 7/087* (2006.01)
*H03L 7/113* (2006.01)
*H03L 7/18* (2006.01)

(52) U.S. Cl.
CPC ........... *H03B 5/124* (2013.01); *H03B 5/1212* (2013.01); *H03B 5/1243* (2013.01); *H03B 5/1265* (2013.01); *H03B 5/1293* (2013.01); *H03L 1/026* (2013.01); *H03L 7/087* (2013.01); *H03L 7/113* (2013.01); *H03L 7/18* (2013.01)

(58) Field of Classification Search
USPC .............................. 331/167, 16, 34, 179, 176
See application file for complete search history.

US 10,419,008 B2

SYSTEM AND METHOD FOR VOLTAGE-CONTROLLED OSCILLATOR CALIBRATION

CLAIM OF PRIORITY

This patent application is a continuation of U.S. patent application Ser. No. 15/234,743, filed Aug. 11, 2016, which in turn makes reference to, claims priority to and claims benefit from U.S. Provisional Patent Application Ser. No. 62/232,688, filed on Sep. 25, 2015. Each of above identified applications is hereby incorporated herein by reference in its entirety.

FIELD

The present disclosure relates to calibration of voltage-controlled oscillators (VCOs).

BACKGROUND

A voltage-controlled oscillator (VCO) is a circuit used in many clocking components and systems such as phase locked loops (PLLs) and local oscillators (LOs). The objective of a VCO is to output a periodic signal (e.g., a clock signal) whose frequency is responsive to a control voltage. This control voltage is typically an analog signal and may be finely granular; therefore, it may also be known as the fine tuning control voltage.

The range of possible output signal frequencies is known as the VCO's frequency tuning range (FTR). A given circuit design will typically implement a VCO having the FTR chosen for the particular application of the given circuit. Accordingly, an industry trend towards wide frequency bandwidth transceivers creates a need for VCOs having a wide FTR.

Increasing a gain of the VCO is the simplest way to increase the FTR of the VCO. The gain of the VCO defines a change in output frequency versus a change in input voltage; therefore, greater VCO gain results in greater FTR.

However, a greater VCO gain also tends to amplify noise from various noise sources, which results in greater phase noise at the output of the VCO. From a noise-reduction perspective, it is generally desirable to reduce the gain of the VCO, which inevitably narrows the FTR.

In order to expand the FIR of a low-gain, low-noise VCO, the VCO may be configured to operate at a plurality of discrete frequency modes. Selecting one of these discrete operations modes (typically, by switching one or more discrete capacitors) may also be known as coarse tuning control.

Contemporary low-noise wide-FTR VCOs thus have both low-gain fine tuning control and discrete coarse tuning control. Typically, the VCO is configured with a plurality of capacitors selectively coupled to an inductor-capacitor (LC) tank via switches. The additional capacitances of the selectively coupled capacitors can greatly increase the overall FTR of the VCO without noticeably worsening the phase noise of the low-gain VCO in each discrete frequency mode.

However, these discrete operational modes of the VCO create one or more discontinuities in the FIR of the VCO, which prevents smoothly fine tuning the VCO output frequency between the discrete coarse tuning settings. In practice, the VCO should first be coarse tuned before the VCO is fine tuned, initial coarse-tuning of the VCO may be known as start-up calibration. Correct start-up calibration is important in order to avoid undesirable re-calibration procedures.

For example, a system operating the VCO at a given coarse tuning setting may determine that the VCO needs to be tuned beyond the available range of the fine tuning control; in this case, the VCO will need to be coarse tuned, causing a jump in the VCO output frequency. This undesirable situation may arise, for example, when the VCO is not appropriately calibrated at start-up. The VCO may be calibrated to an initial temperature (or other operating condition) and after some time, a temperature drift (or change in operating conditions will cause the VCO to change its output frequency such that the frequency shift cannot be compensated for by the fine tuning control.

Therefore, while coarse tuning control allows a low-gain low-noise VCO to operate with a wider FTR, the VCO may be calibrated appropriately to minimize or eliminate undesirable instances of adjusting the coarse tuning control during VCO operation. The inventors have determined that Improvements in calibration of VCOs and their control are desirable.

BRIEF DESCRIPTION OF THE DRAWINGS

Embodiments of the present disclosure will now be described, by way of example only, with reference to the attached Figures.

DETAILED DESCRIPTION

Figure 1:
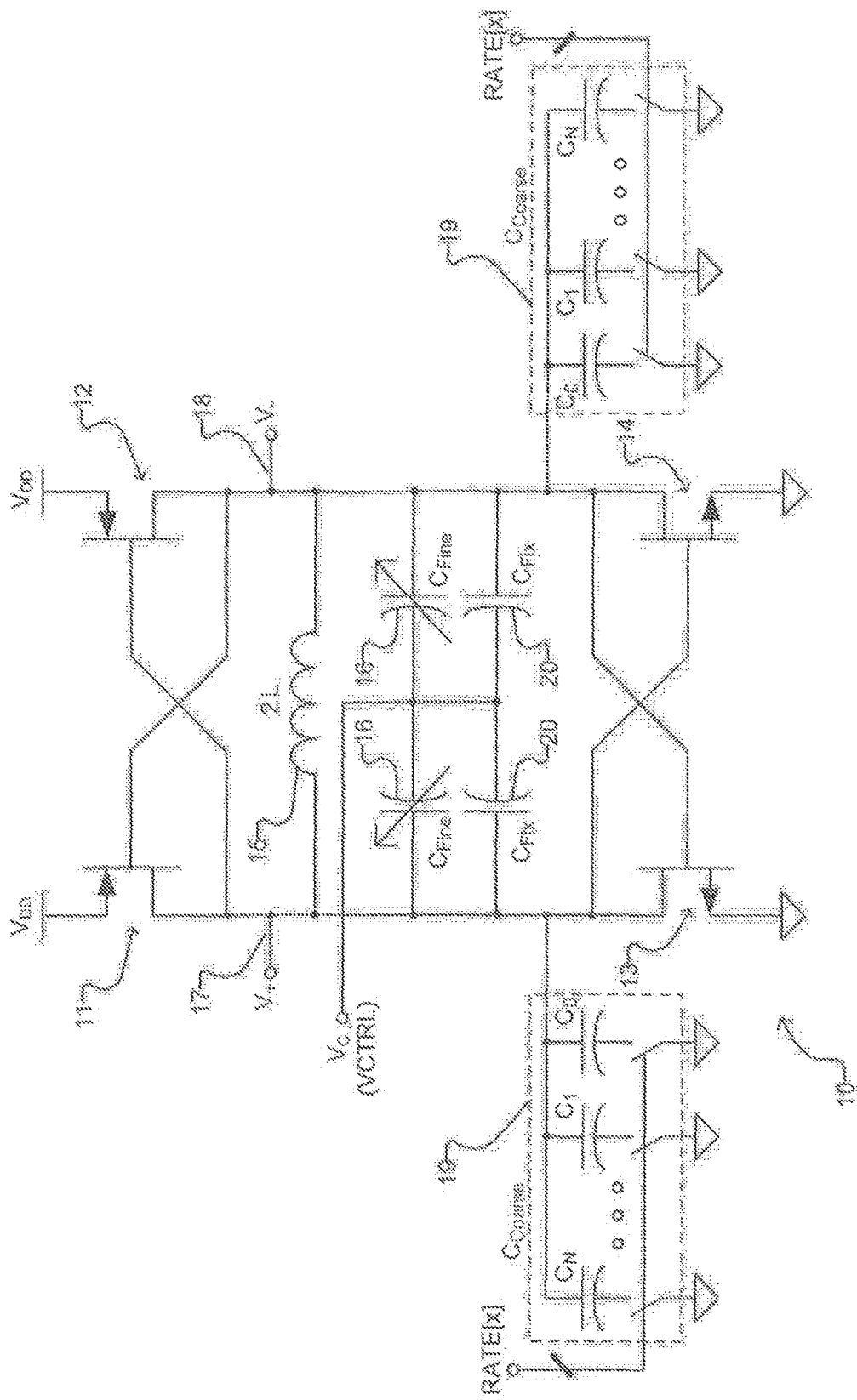
FIG. 1 shows an example LC VCO with coarse-tuning and fine-tuning control according to the prior art.

There are different ways to calibrate a VCO, including, during manufacturing, at start-up (i.e., in a distinct calibration mode before normal operation), and in the background during normal VCO operation also known as mission mode. The present disclosure is directed towards the start-up calibration mode. The start-up calibration mode differs from manufacturer calibration (which, for example, uses electronic fuses to store frequency tuning information) in the sense that the start-up calibration mode may be repeated over the lifetime of the device encompassing the VCO. As a result, the start-up calibration method can calibrate out long-term frequency shifts such as any aging effect when/if the calibration is repeated, for example, at a system re-start. The start-up calibration mode differs from the background calibration mode in the sense that the start-up calibration is only performed occasionally (e.g. during a re-start) and is often performed on an open-loop PLL which overall lends to a simpler calibration circuitry, in contrast with a background calibration scheme applied in mission mode on a closed-loop PLL system. Although background calibration methods can provide good performance and can tolerate wider environmental variations, the known methods of background calibration are complex and often degrade the phase noise and jitter performance when the actual calibration routine kicks in intermittently.

Certain aspects of the present disclosure provide an improved start-up calibration technique for a given VCO design having coarse-tuning and fine-tuning controls, in order to improve (extend) the tolerable post-calibration environmental variations. This may help avoid overdesigning with a high-gain VCO, hence providing the opportunity for a low-phase-noise VCO design.

According to an embodiment of the present disclosure, in a method for calibrating a voltage-controlled oscillator (VCO) of a phase-locked loop (PLL) system, where a VCO output frequency is dependent on a fine-tuning control voltage input, a coarse-tuning control input and one or more operational conditions, where the VCO output frequency varies monotonically with changes in each of the one or more operational conditions, the method comprises: providing a frequency characteristics dataset indicating the VCO output frequency across a range of allowable values for each of the coarse-tuning control input and the fine-tuning control voltage input and a range of expected values of the one or more operational conditions; for each of a plurality of coarse-tuning control input settings, determining a polynomial function describing a calibration voltage for the control voltage input with respect to the one or more operational conditions, wherein the polynomial function is determined based on the frequency characteristics dataset to generate a constant VCO output frequency such that the constant VCO output frequency is a midpoint of a usable VCO frequency range, wherein the usable VCO frequency range comprises all VCO output frequencies that can be generated at the coarse-tuning control input setting over ail of the range of expected values of the one or more operational conditions using only allowable values of the fine tuning control voltage; measuring the one or more operational conditions; placing the PLL system In an open-loop state; applying the calibration voltage corresponding to the measured one or more operational conditions as determined by the polynomial function to the control voltage input; sweeping through a range of coarse-tuning control input values to determine a selected coarse-tuning control input that minimizes a difference between the constant VCO output frequency and a target frequency; and enabling the coarse-tuning control input setting of VCO corresponding to the selected coarse-tuning control input.

According to another embodiment of the present disclosure, in a method for calibrating an inductor-capacitor-based voltage-controlled oscillator (VCO) of a phase-locked loop (PLL) system, where a VCO output frequency is dependent on a fine-tuning control voltage input, a coarse-tuning control input and one or more operational conditions, where the VCO output frequency varies monotonically with changes in each of the one or more operational conditions, the method comprises, providing a frequency characteristics dataset indicating the VCO output frequency across a range of allowable values for each of the coarse-tuning control input, the fine-tuning control voltage Input and a range of expected values of the one or more operational conditions; for each of a plurality of coarse-tuning control input settings, determining a polynomial function describing a calibration voltage for the control voltage input with respect to the one or more operational conditions, wherein the nonlinear function is determined based on the frequency characteristics dataset to generate a constant VCO output frequency such that a difference is minimized between: an average of a first fine-tuning control voltage input value that generates the constant VCO output frequency at a minimum expected value of the one or more operational conditions and a second fine-tuning control voltage input value that generates the constant VCO frequency at a maximum expected value of the one or more operational conditions; and a midpoint of the range of allowable values of the fine-tuning control voltage input, measuring the one or more operational conditions; placing the PLL system in an open-loop state; applying the calibration voltage corresponding to the measured one or more operational conditions as determined by the polynomial function to the control voltage input, sweeping through a range of coarse-tuning control input values to determine a selected coarse-tuning control input that minimizes a difference between the constant VCO output frequency and a target frequency, and enabling the coarse-tuning control Input setting of VCO corresponding to the selected coarse-tuning control input.

According to yet another embodiment of the present disclosure, a phase-locked loop (PLL) system comprises: a voltage-controlled oscillator (VCO) having a fine-tuning control voltage input and a coarse-tuning control input, and a VCO output frequency dependent on the fine-tuning control voltage input, the coarse-tuning control input, and one or more operational conditions; a feedback system connected to receive a measure of the VCO output frequency and compare the measure of the VCO output frequency to a reference frequency for providing a control voltage to the fine-tuning control voltage input; a digital-to-analog converter (DAC) selectively connectable to the fine-tuning control voltage input of the VCO for providing an open-loop calibration voltage to the fine-tuning control voltage input; one or more sensors for measuring the one or more operational conditions; and, a controller connected to receive an operational condition signal from the one or more sensors and to provide a digital calibration control value to the DAC for generating the calibration voltage, the controller configured to calibrate the VCO by disconnecting the feedback system from the fine-tuning control voltage input and connecting the DAC to the fine-tuning control voltage input, wherein the controller generates the digital calibration control value based on the operational condition signal according to a polynomial function describing the calibration voltage with respect to the one or more operational conditions; wherein the polynomial function is determined based on a frequency characteristics dataset, the frequency characteristics dataset indicating the VCO output frequency across a range of allowable values for each of the coarse-tuning control input and the fine-tuning control voltage input and a range of expected values of the one or more operational conditions, to generate a constant VCO output frequency such that the constant VCO output frequency is a midpoint of a usable VCO frequency range, wherein the usable VCO frequency range comprises all VCO output frequencies that can be generated at the coarse-tuning control input setting over all of the range of expected values of the one or more operational conditions using only allowable values of the fine tuning control voltage.

According to yet another embodiment of the present disclosure, a phase-locked loop (PLL) system comprises: a voltage-controlled oscillator (VCO) having a fine-tuning control voltage input and a coarse-tuning control input, and a VCO output frequency dependent on the fine-tuning control voltage input, the coarse-tuning control input, and one or more operational conditions; a feedback system connected to receive a measure of the VCO output frequency and compare the measure of the VCO output frequency to a reference frequency to control the fine-tuning control voltage input of the VCO; a digital-to-analog converter (DAC) selectively connectable to the fine-tuning control voltage input of the VCO for providing an open-loop calibration voltage to the fine-tuning control voltage input; one or more sensors for measuring the one or more operational conditions; and, a controller connected to receive an operational condition signal from the one or more sensors and to provide a digital calibration control value to the DAC for generating the calibration voltage, the controller configured to calibrate the VCO by disconnecting the feedback system from the fine-tuning control voltage input and connecting the DAC to the fine-tuning control voltage input, wherein the controller generates the digital calibration control value based on the operational condition signal according to a polynomial function describing the calibration voltage with respect to the one or more operational conditions, wherein the polynomial function is determined based on a frequency characteristics dataset, the frequency characteristics dataset indicating the VCO output frequency across a range of allowable values for each of the coarse-tuning control input and the fine-tuning control voltage input and a range of expected values of the one or more operational conditions, to generate a constant VCO output frequency such that a difference is minimized between; an average of a first fine-tuning control voltage input value that generates the constant VCO output frequency at a minimum expected value of the one or more operational conditions and a second fine-tuning control voltage input value that generates the constant VCO frequency at a maximum expected value of the one or more operational conditions; and a midpoint of the range of allowable values of the fine-tuning control voltage input.

The Purpose of Coarse Tuning and Fine Tuning in a VCO

An example of a conventional LC-based VCO (LC VCO) is shown in FIG. 1. The VCO 10 comprises an LC tank resonator and an amplifier. The LC tank, comprised of an inductor 12, variable capacitors (varactors) 18, switchable capacitor banks 19, and fixed capacitances 20, serves as a frequency selective resonator and, in practice, is inevitably lossy (i.e. includes small series resistances, not shown). The amplifier compensates for the losses in the lossy resonator and comprises a cross-coupled arrangement of transistors 11, 12, 13, and 14. The transistors of the amplifier provide transconductance gain to return energy into the LC tank to sustain steady-state oscillations at the VCO output across positive and negative terminals 17 and 18.

A fine tuning control voltage $V_C$ received at a terminal VCTRL fine-tunes the pair of varactors 16. Digital control bits RATE[x] provide a setting for coarse-tuning the pair of switchable capacitor banks 19. The variable capacitances of the varactors 18 and the switchable capacitor banks 19 represent the change in capacitance (and therefore, tuning range) of the LC tank. In addition to these variable capacitances, the LC tank also includes fixed capacitances 20, which are related to parasitic capacitances associated with transistors 11 to 14 and interconnections, as well as a minimum (fixed) component of the varactor capacitance.

The oscillation frequency f of the VCO 10 is defined by Equation 1, where L represents half the inductance value of a differential inductor 15 in FIG. 1. In Equation 1, $C_{Fine}$ is the voltage-dependent capacitance component of varactors 16 determined by fine-tuning control voltage $V_C$, $C_{Coarse}$ is the equivalent coarse-tuned capacitance of switchable capacitors 19 set by the RATE control bus, and $C_{Fix}$ represents the fixed capacitance value on the LC tank, including various parasitic capacitances and the minimum component of varactor capacitance at an operating point, in practical designs, $(C_{Fix}+C_{Coarse}) \gg C_{Fine}$.

$$f = \frac{1}{2\pi\sqrt{L(C_{Fix} + C_{Coarse} \pm C_{Fine})}} \qquad \text{Equation 1}$$

As mentioned in the background, the rate of output frequency change versus input control voltage change defines the gain of the VCO. The VCO gain is denoted by $K_{VCO}$ and is defined by the derivative relationship shown in Equation 2.

$$K_{VCO}\left(\frac{Hz}{Volt}\right) = \frac{df}{dV_C} \approx \frac{\Delta f}{\Delta V_C} \qquad \text{Equation 2}$$

Assuming $C_{Fine}$ is the main voltage-dependent capacitance in the LC tank, the gain of the VCO circuit of FIG. 1 is directly proportional to the variable capacitance and inversely a function of the total capacitance. Equation 3 represents the approximate relationship between VCO gain and the capacitances of the LC tank:

$$K_{VCO} \propto \frac{C_{Fine}}{(C_{Fix} + C_{Coarse} \pm C_{Fine})^{1.5}} \qquad \text{Equation 3}$$

According to Equation 3, increasing the varactor capacitance $C_{Fine}$ increases $K_{VCO}$ hence increases the tunability of the VCO with respect to the control voltage $V_C$. In other words, increasing the varactor capacitance $C_{Fine}$ increases the FTR of the VCO.

However, varactor 16 is a voltage-dependent capacitance: therefore, if will also convert any amplitude noise on the tank, or on the control voltage, to phase noise, which is a phenomenon known as AM-to-PM conversion. In other words, a larger varactor capacitance leads to more phase noise. Consequently, it is generally desirable to design a low-gain VCO because a low-gain VCO is less sensitive to various sources of amplitude noise, which leads to lower phase noise. Phase noise, denoted by $\mathscr{L}$ exhibits the following relationship with VCO gain: low $K_{VCO}$ in (Hz/Volt)⇒ low $\mathscr{L}$ ($\Delta$f) in (dBc/Hz).

As a result of phase noise being a function of VCO gain, state-of-the-art VCOs are designed to have a $K_{VCO}$ as low as possible in order to exhibit low phase noise. However, a low-gain VCO suffers from limited frequency tuning range (FTR), i.e. a small frequency range covered by fine-tuning control voltage input $V_C$ over its useful voltage range.

Figure 2:
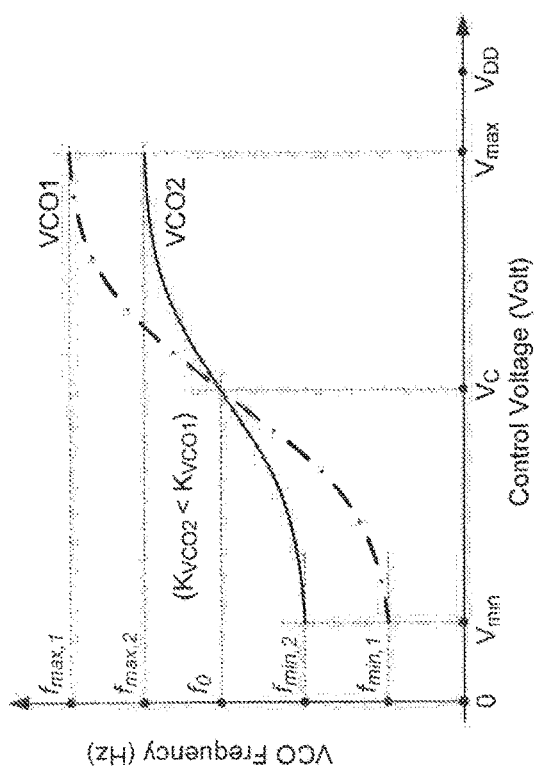
FIG. 2 shows frequency tuning characteristics of two example VCOs.

FIG. 2 shows the frequency characteristics of two voltage-controlled oscillators. VCO1 and VCO2, having the same center frequency $f_0$. VCO2 has a lower VCO gain than the VCO1 (i.e., $K_{VCO2}<K_{VCO1}$). The usable range of control voltage in both VCOs is assumed to be $V_{min} \leq V_C \leq V_{max}$. This range is usually a subset of the whole power supply voltage range (0 to $V_{DD}$) and is determined by voltage headroom constraints in the system using the VCO. For example. In a charge-pump-based PLL system with power supply rails of $V_{DD}$=1.8V and $V_{SS}$=0V. PMOS and NMOS current source transistors at the output of the charge pump may have $V_{DSat}$=0.4V as a minimum voltage between drain and source to operate properly in saturation. Thus, the usable voltage range for $V_C$ will be from $V_{min}$=0.4V to $V_{max}$=1.8V−0.4V=1.4V.

As shown in Figured, because of the $K_{VCO}$ gain difference between VCO2 and VCO1, the frequency tuning range of VCO2 (i.e., $FTR_2$) is smaller than the frequency tuning range of VCO1 (i.e., $FTR_1$).

Consequently, a design goal of a high performance VCO is to select $K_{VCO}$ gain value as low as possible to achieve a desired low phase noise, while also ensuring the selected $K_{VCO}$ gain value is high enough to produce an FTR covering a suitable tuning range around a target frequency. This suitable tuning range is typically necessary to allow the VCO to compensate for VCO frequency drifts that may fee caused by environmental variations (e.g. temperature) and instantaneous noise.

A low-gain VCO may include selectable capacitor banks to provide coarse frequency tuning in order to increase the tuning range of the low-gain VCO. The additional tuning range provided by the coarse tuning settings allows the low-gain VCO to cover more frequencies of interest for various applications. The selectable capacitor banks include capacitors that can be switched in or out of the LC tank, thereby changing the center frequency of the VCO.

Figure 3:
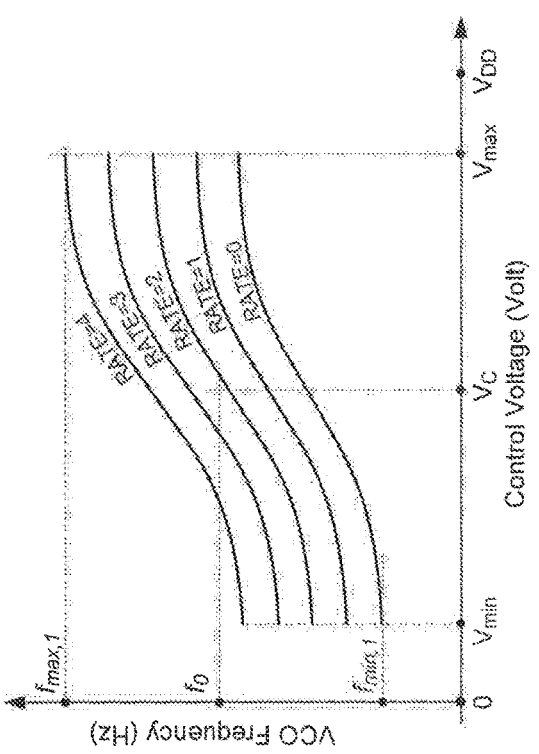
FIG. 3 shows frequency characteristics of an example VCO with coarse-tuning and fine-tuning control.

FIG. 3 shows the frequency characteristics of a VCO with fine tuning and coarse tuning. The RATE setting represents different coarse tuning settings available by switching in and out the capacitors of the banks 19. Each RATE setting provides the VCO with a different center frequency $f_0$. In the example plots shown in FIG. 3, the overall tuning range from RATE=0 to RATE=4 (i.e., $FTR=f_{max,1}-f_{min,1}$) is the same as the $FTR_1$ of the high-gain VCO1 in FIG. 2. Moreover, the setting RATE=2 is most closely centered around the target frequency $f_0$ and when the VCO of FIG. 3 is configured to this setting, the VCO of FIG. 3 exhibits a gain $K_{VCO,RATE2}$ similar to $K_{VCO2}$ of the low-gain VCO2 in FIG. 2. Therefore, the VCO of FIG. 3 advantageously has a wide FTR similar to VCO1 of FIG. 2 and low phase noise similar to VCO2 of FIG. 2.

VCO Start-up Calibration for Static Operating Conditions

Typically, the fine-tuning of the VCO (i.e., adjusting the frequencies available for a given RATE setting over the entire range of input control voltages) is used by a closed-loop system for maintaining a constant frequency signal or clock output at the VCO. A closed-loop system, such as PLL measures the output frequency of the VCO, compares the output frequency to a reference frequency, and adjusts the fine tuning control voltage of the VCO depending on a frequency difference between the output signal and the reference signal.

Calibrating the VCO at system start-up involves selecting the appropriate coarse-tuning setting for operating the VCO at a desired center frequency. After start-up calibration (i.e., after the coarse tuning), the system, such as a PLL, automatically fine tunes the VCO via closed-loop negative feedback to maintain a constant output frequency.

Appropriate start-up calibration of the VCO is often performed to ensure proper functionality of the VCO in a system such as the PLL. If an incorrect coarse tuning setting (e.g., the RATE setting in FIG. 3) is chosen, the PLL may not have enough fine-tuning range to achieve the desired output frequency. For example, in FIG. 3, the setting RATE=2 represents a calibrated VCO for frequency $f_0$.

In FIG. 3, if the setting RATE=0 were chosen, the PLL would not foe able to tune the VCO to the desired $f_0$ frequency because the $V_{max}$ fine tuning control voltage on the RATE=0 curve corresponds to a lower frequency than the desired $f_0$ frequency. Thus, the RATE=0 coarse tuning setting may not be the appropriate setting for calibrating the VCO at start-up.

VCO Start-up Calibration for Dynamic Operating Conditions

Whereas calibrating the VCO for static operating conditions mainly considers whether the desired output frequency is well-centered in the fine tuning control voltage curve of a chosen RATE setting (e.g., each curve of FIG. 3) at a given fixed operating conditions, calibrating the VCO for dynamic operating conditions may require broader considerations. Specifically, calibrating the VCO for dynamic operating conditions considers both whether the desired output frequency at the present operating conditions is achieved within the allowable range (not necessarily the center) of the fine tuning control voltage curve of a chosen RATE setting, and whether the desired output frequency will be achievable and well-centered on the tuning control voltage curve of the chosen RATE setting for all operating conditions after the calibration.

The most common operating conditions affecting VCO frequency are power supply voltage and environmental factors, such as temperature and moisture. Varying operational conditions, such as the conditions mentioned above, can cause the VCO to speed up or slow down during normal operation. Speeding up or slowing down of the VCO can cause the output frequency of the VCO to deviate from the desired output frequency, and consequently make the PLL feedback loop adjust the VCO's control voltage to compensate for this error. The present disclosure describes methods and systems for calibrating a VCO according to varying or dynamic operating conditions.

Junction Temperature ($T_j$)

Figure 4A:
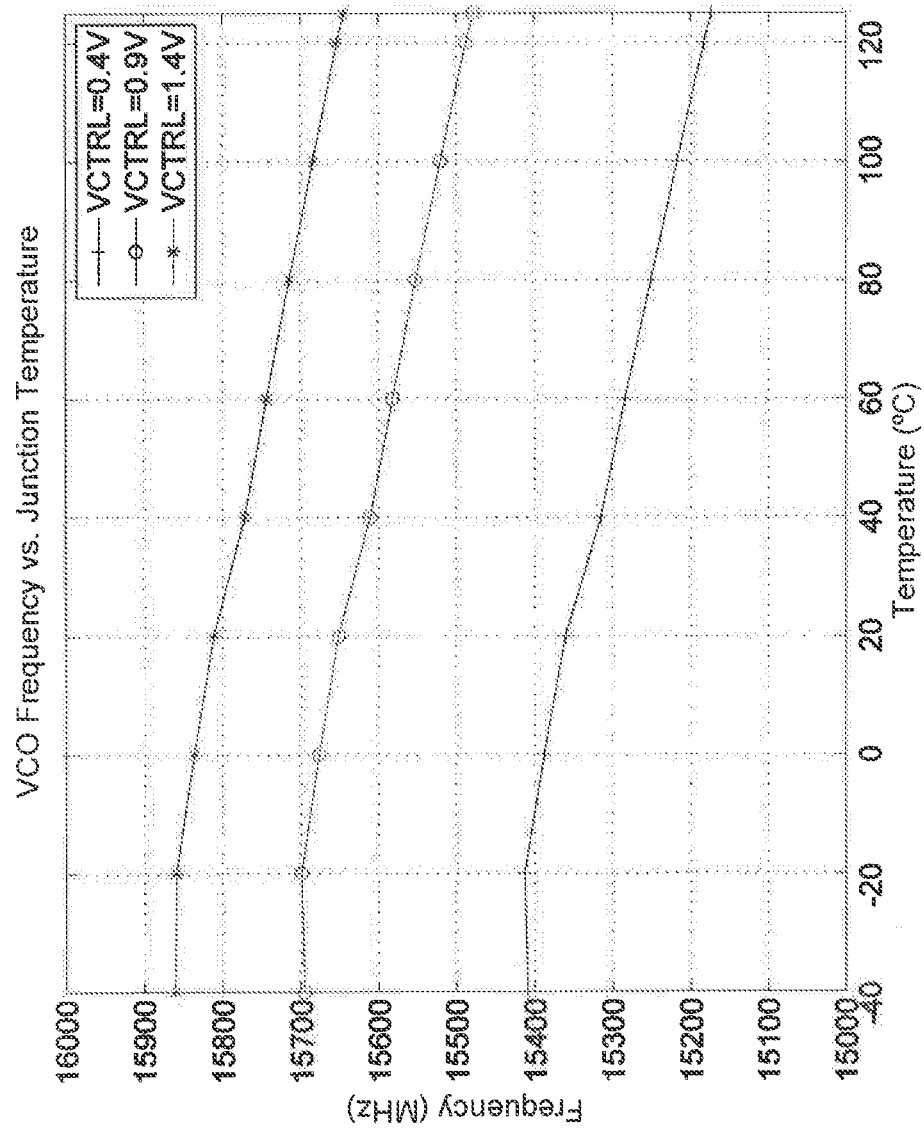
FIG. 4A shows example VCO frequency characteristics versus temperature with control voltage as a parameter.

FIG. 4A is a graph showing frequency characteristics of an LC VCO according to the present disclosure. The curves of the graph plot frequency in relation to varying junction temperature, at three different fine tuning control voltage settings. An increase in the junction temperature ($T_j$) of the VCO's circuits causes a decrease in the VCO output frequency. Conversely, a decrease in the junction temperature causes an increase in the VCO output frequency. The relationship between VCO junction temperature and VCO output frequency is related to various temperature-dependent circuit effects, including: temperature sensitivity of the coarse-tuning capacitors (e.g. discrete metal-oxide-metal (MoM) or metal-insulator-metal (MiM) capacitors), temperature sensitivity of fine-tuning capacitors (e.g. varactors), nonlinear parasitic capacitances of the transistors, and: resistance in the lossy inductor and interconnections of the LC tank. These temperature-dependent characteristics of the VCO circuit elements affect the output frequency by changing the resonant frequency, damping factor and oscillation swing of the VCO.

Figure 4B:
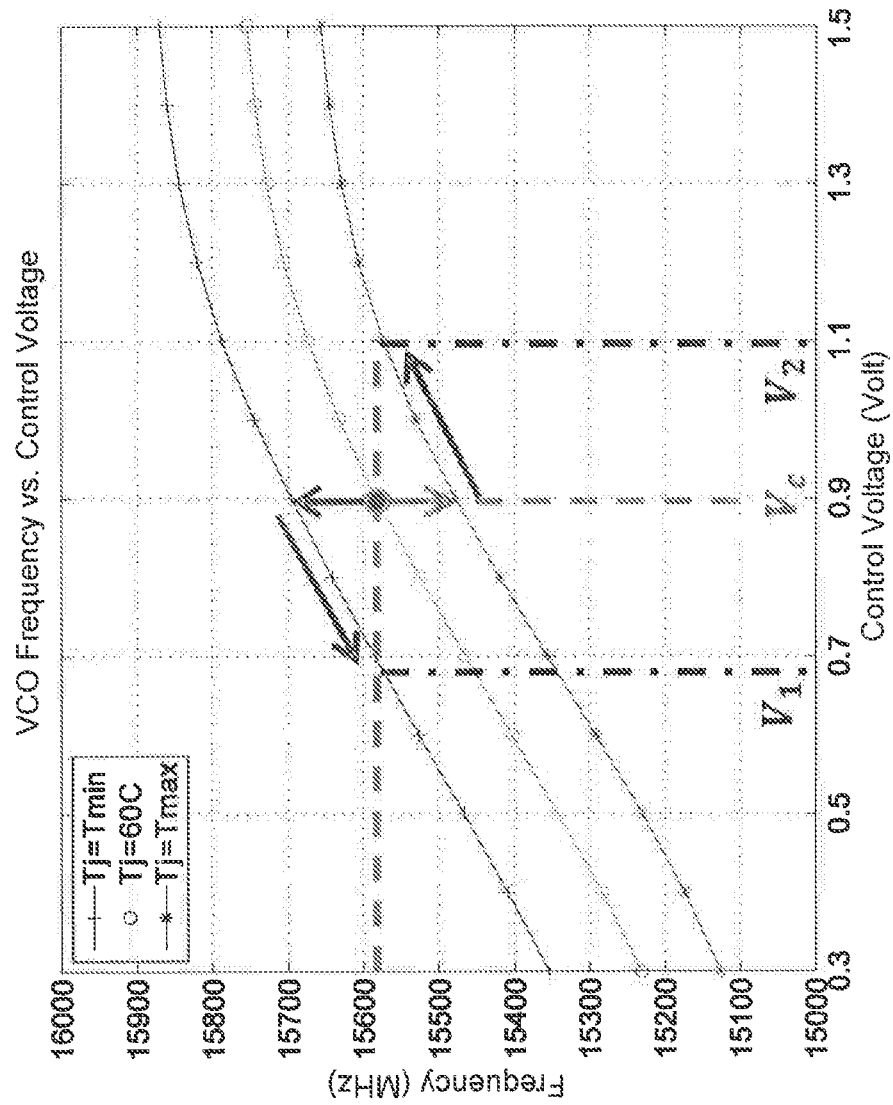
FIG. 4B shows example VCO frequency characteristics versus control voltage with temperature as a parameter.

FIG. 4B is a graph showing frequency characteristics of the VCO of FIG. 4A according to a different, perspective; the graph plats frequency in relation to varying fine tuning control voltage $V_C$, at three different junction temperatures: 60 degrees: Celsius (° C.), maximum operational junction temperature, and minimum operational junction temperature.

The graph of FIG. 4B illustrates art example normal operation of the VCO that may be desirable. Thus, the VCO of FIG. 4B is appropriately calibrated. The graph of FIG. 4B will now be described to explain why the calibration is appropriate for normal operation of the VCO.

In this example, the VCO has been calibrated by choosing a coarse tuning setting (RATE value, not shown) such that at fine tuning control voltage=$\frac{1}{2}V_{DD}$=0.9V and junction temperature of $T_j$=60° C., the VCO output frequency $f_0 \approx 15,570$ MHz, which is the presumed desired output frequency.

The calibration is based on the initial constraints of fine tuning control and junction temperature. The fine tuning control voltage constraint is $V_c$=0.9V, which is approximately equal to the midrail voltage, and is defined as $\frac{1}{2}V_{DD}$ where $V_{DD}$=1.8V. Choosing a midrail initial control voltage at nominal temperature is a simple approach for achieving sufficient fine-tuning range, as will be explained below.

The junction temperature constraint is $T_j$=60° C. because this temperature is the expected nominal operational temperature of the VCO circuit. The expected nominal temperature may be based on assumptions of normal system load and proper cooling hardware function. Based on these two constraints, the VCO is calibrated by choosing a coarse-tubing setting that will allow the VCO to output a 15,570 MHz clock signal at $V_c$=0.9V and $T_j$=60° C.

However, unforeseen events such as change in ambient temperature, system cooling fan failure, building air conditioning failure, increased processor load heating the entire chip of the VCO, etc., may cause the junction temperature of the VCO circuitry to rise. If the temperature of the VCO increases to an extreme hot value of $T_{max}$ (e.g., 125° C.), the VCO In this example exhibits a frequency decrease from 13,570 MHz to approximately 15,470 MHz.

In response to the decrease in VCO output frequency, the system operating the VCO, such as a closed-loop PLL, can adjust the fining-tuning control of the VCO by increasing the control voltage $V_C$ up to the value denoted by $V_2$ (e.g. 1.1V) in order to keep the VCO output frequency locked at the target frequency of 15,570 MHz.

Conversely, if the junction temperature decreases to an extreme cold value of $T_{min}$ (e.g., −40° C.), the VCO exhibits a frequency increase from 15,570 MHz to approximately 15,700 MHz; in response to the Increase in VCO output frequency, the system (e.g., closed-loop PLL) can adjust the fine-tuning control of the VCO by decreasing the control voltage $V_C$ down to the value denoted by $V_1$ (e.g., 0.7V) in order to keep the VCO output frequency locked to the target frequency of 15,570 MHz.

The VCO of FIG. 4B is appropriately calibrated because the VCO does not need to be recalibrated in normal operation as the junction temperature varies in both directions to these extreme cases. Only fine-tuning control adjustments need to be made by the PLL system in order to smoothly and continuously keep the VCO locked to the desired output frequency; the VCO does not need any coarse-tuning adjustment (e.g. a different RATE value) that would cause discontinuous jumps (glitches) in output frequency and a transient to re-acquire frequency lock.

Figure 4C:
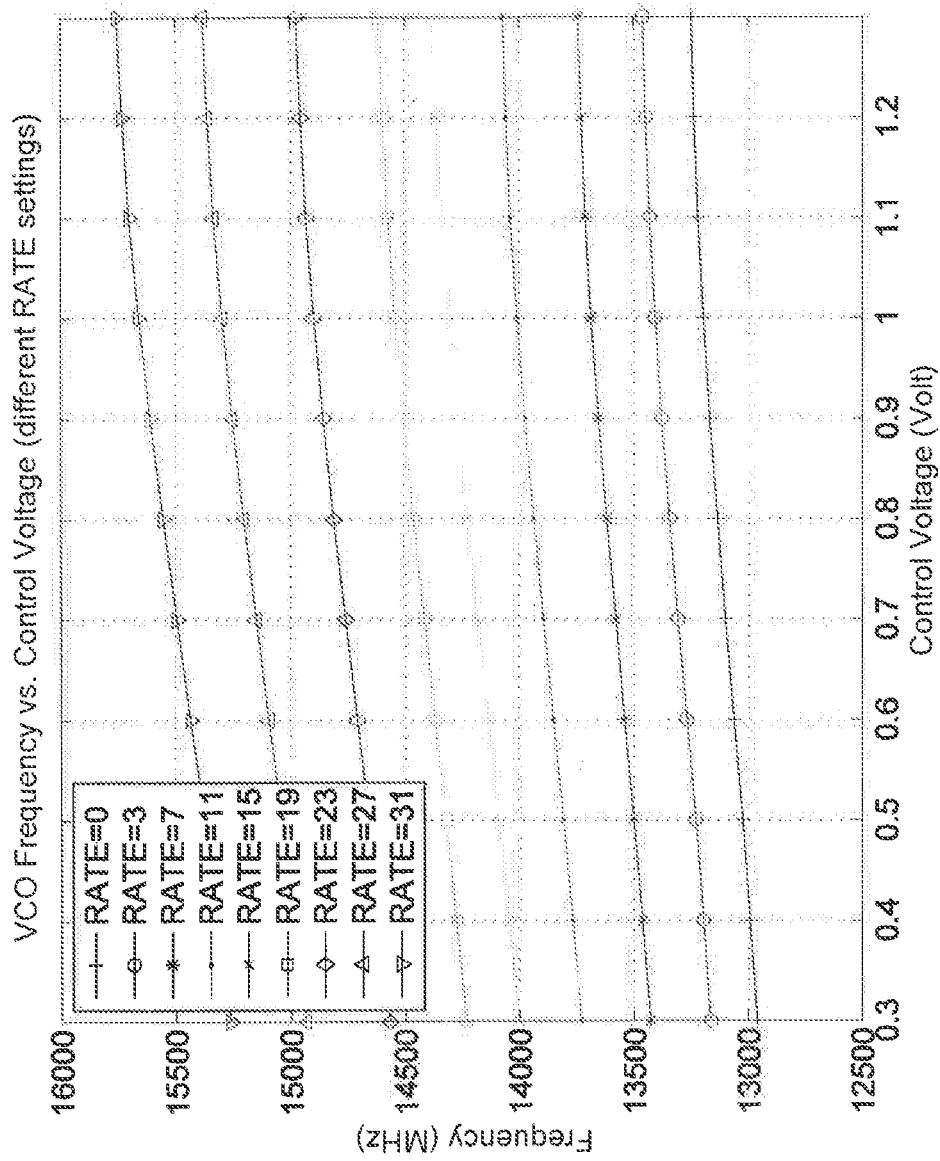
FIG. 4C shows example VCO frequency characteristics versus control voltage with coarse tuning (RATE) as a parameter.

FIG. 4C is a further graph showing frequency characteristics of the VCO of FIGS. 4A and 4B. While the graph of FIG. 4B plots frequency in relation to varying fine tuning control voltage $V_C$ for various junction temperature curves, the graph of FIG. 4C plots frequency in relation to varying fine tuning control voltage $V_C$ for various coarse-tuning setting curves (RATE values) at a nominal temperature. Note that only 1 out of every 4 available coarse-tuning settings (RATE=N) of the VCO are shown in FIG. 4C for simplicity.

Referring back to FIG. 4B above, the calibration example assumes that it is desirable for the fine tuning control voltage to approximately equal midrail voltage and that the expected operational temperature will be 60° C.

However, incorrect initial assumptions may result in a VCO calibration that does not leave enough fine-tuning control range to compensate for all possible dynamic operating conditions. If operating condition variables such as temperature, supply voltage, and moisture drift enough in normal post-calibration operation to necessitate a fine tuning control voltage value beyond its allowable range of $V_{min} \leq V_C \leq V_{max}$, then an undesirable re-calibration of the VCO would likely be necessary. Re-calibration involves adjusting the coarse-tuning control setting by reconfiguring the switchable capacitor banks 19 to go from one capacitor configuration (e.g. RATE=N) to a next capacitor configuration (e.g. RATE=N±1 or N±2) in order to compensate for the speed-up or stow-down in the VCO and in order to help bring the control voltage into the allowable range.

Re-calibration is generally undesirable because it typically requires re-starting the system operating the VCO (such as a PLL) and causing VCO's output signal or clock to have an invalid frequency and high phase jitter during a transient interval after the re-start and before re-acquiring the frequency and phase lock status to reference frequency signal.

Therefore, in some applications, the system seeks to avoid re-calibration as much as possible, and may only allow re-calibration at extreme conditions such as a power failure, during special maintenance intervals, or after a long-term drift over weeks or months (e.g. an aging effect or moisture sipping).

FIG. 4C also shows that the various RATE curves (representing discrete coarse-tuning settings) have overlapping frequency tuning ranges. That is, for the same fine tuning control voltage $V_C$ (fine-tuning) range, adjacent RATE settings (coarse-tuning) have some common VCO output frequencies. More specifically, under similar operating conditions, a VCO calibrated at RATE=N can generate the same output frequency as when the VCO is calibrated at RATE=N±1 or possibly N±2, based on different fine tuning control voltages as long as the fine tuning control voltage is within the allowable operating range.

As a consequence, the overlapping FTRs of adjacent RATE coarse-tuning settings provides multiple calibration options to the VCO, yet also creates a need for optimizing the calibration. The optimal calibration (the best coarse-tuning setting) generally minimizes the possibility of re-calibrating the VCO during normal post-calibration operation with operating conditions changed, as compared to sub-optimal calibrations.

Accordingly, the present disclosure relates to an improved start-up calibration method and system for maximizing the tolerable environmental variations in post-calibration operation.

Moreover, the improved start-up calibration method allows VCOs according to the present disclosure to be designed with less VCO gain than conventional VCOs (less built-in margin for error), which in turn helps reduce phase noise and improve jitter performance.

VCO Calibration Based on Temperature

Figure 5:
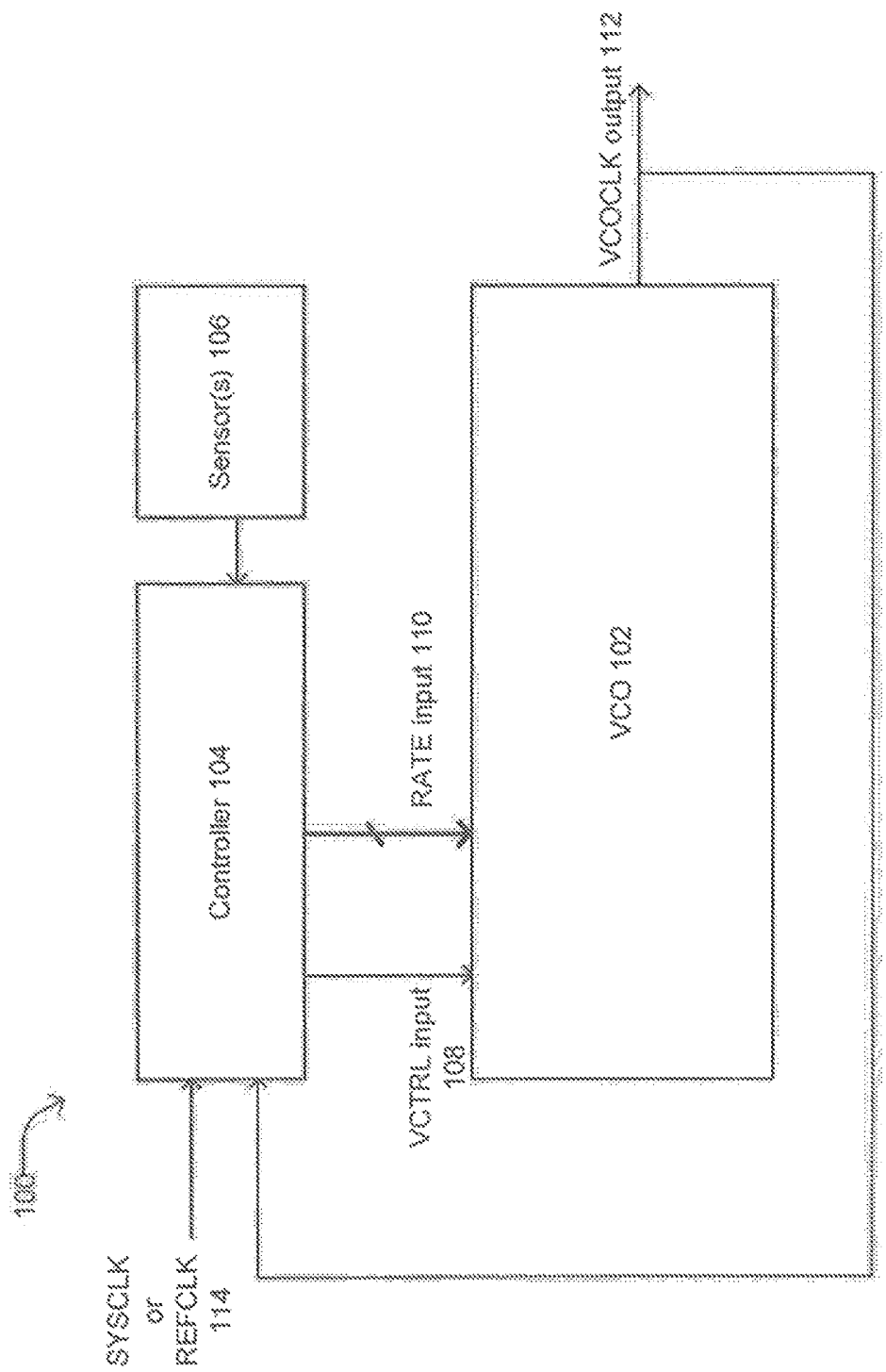
FIG. 5 is a diagram of a system for calibrating a VCO according to embodiments of the present disclosure.

FIG. 5 is a diagram of a system for calibrating a VCO according to embodiments of the present disclosure. The system 100 comprises a VCO 102 in electrical communication with a controller 104, which is in electrical communication with a sensor 106. The VCO 102 generates a clock signal at an output (VCOCLK) 112 having a frequency-based on a fine tuning control voltage $V_C$ received at input (VCTRL) terminal 108. The relationship between the frequency of the output 112 and the input 108 may be referred to as fine-tuning control. The fine tuning control voltage $V_C$ may be provided to the VCO 102 by the controller 104 or by another system operating the VCO 102.

The VCO also has coarse-tuning control (RATE) input terminal 110 so that frequency of the output 112 is also based on the coarse-tuning control, which is a digital control signal generated by the controller 104. The controller 104 calibrates the VCO by selecting an appropriate RATE 110 signal value and providing the value to the VCO. The selected RATE 110 value is based on one or more sensor 108 measurements, such as on-die temperature, on-die moisture, and power supply voltage Basing the VCO calibration on such sensor measurements helps to optimize the calibration by minimizing a possibility of re-calibrating the VCO during normal operation.

The controller 104 also has inputs for receiving the VCOCLK output 112 of the VCO and a frequency reference clock signal, such as SYSCLK or REFCLK 114. The controller 104 compares the two signals 112 and 114 and also bases the VCO calibration (i.e., selecting the appropriate RATE 110 value) on a difference between the frequencies of the signals 112 and 114. The system 100 or the controller 104 may also include a feedback divider so that the controller 104 compares the SYSCLK or REFCLK 114 to a divided down version of the VCOCLK 112.

Figure 6:
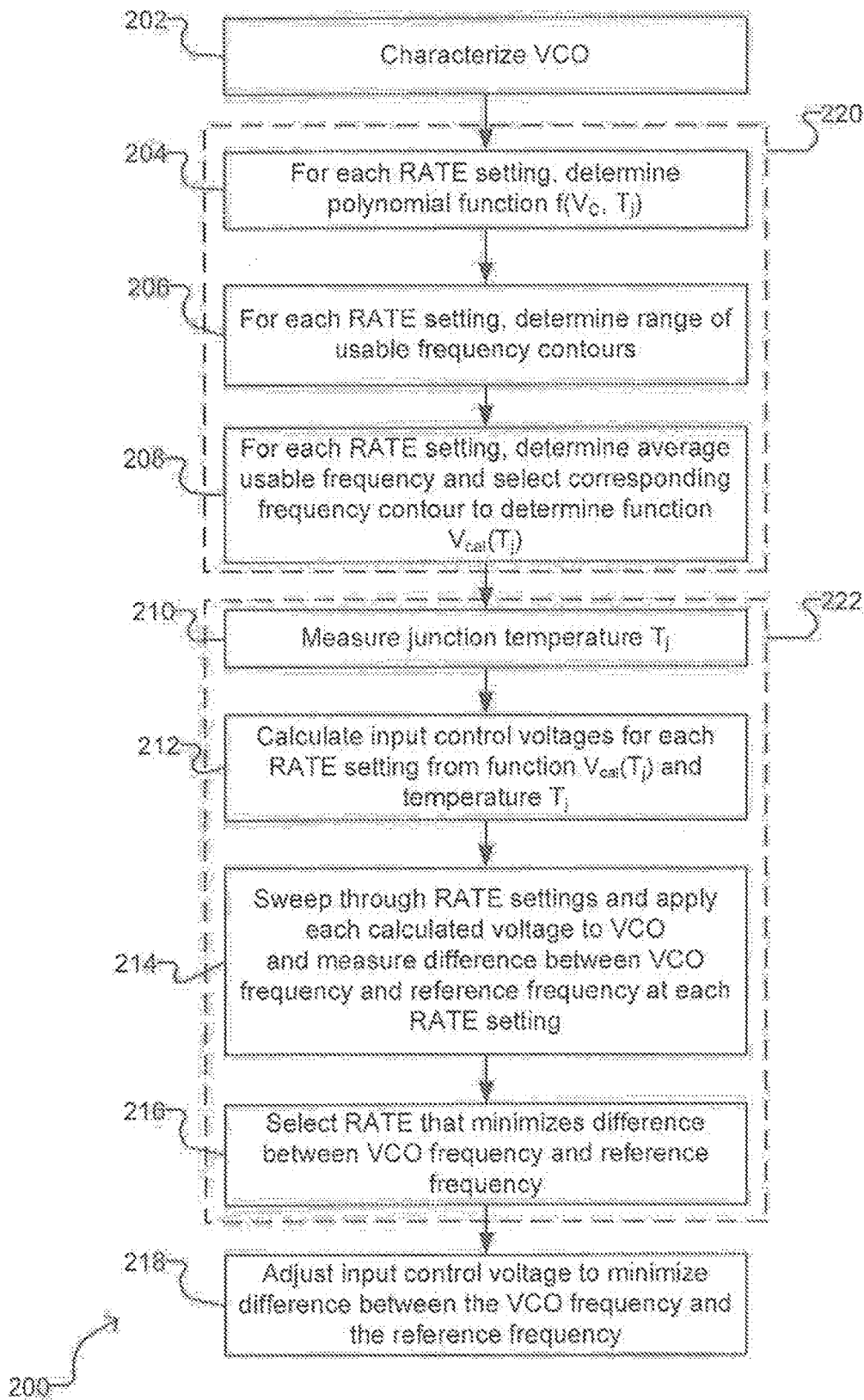
FIG. 6 is a flowchart diagram of a method for calibrating the VCO of FIG. 5.

FIG. 6 is a flowchart diagram of an embodiment of a method for calibrating a VCO. The method 200 may be executed by the controller 104 of FIG. 5 for calibrating the VCO 102. At Step 202, the VCO 102 under test is characterized. In an embodiment, the VCO 102 is a VCO with an inductor-capacitor bank comprising a plurality of discrete switchable capacitors.

Assume the VCO 102 has positive VCO gain (that is, frequency f monotonically increasing versus fine tuning control voltage $V_C$) and negative temperature coefficient (that is, frequency f monotonically decreasing versus junction temperature $T_j$). The VCO frequency may vary monotonically with changes in each of the one or more operational conditions. Characterizing the VCO involves gathering data that is representative of these monotonic changes of the VCO's behavior.

Characterizing the VCO at 202 may be clone from model simulations or lab measurements by sweeping all possible values of the fine tuning control voltage $V_C$, the junction temperature $T_j$, and the coarse-tubing control RATE setting, and recording the output frequency f of the VCO output signal VCOCLK. Characterizing the VCO generates a set of data having relationships in four dimensions: fine tuning control voltage $V_C$, the junction temperature $T_j$, the coarse-tuning control RATE setting, and output frequency f.

Figure 7A:
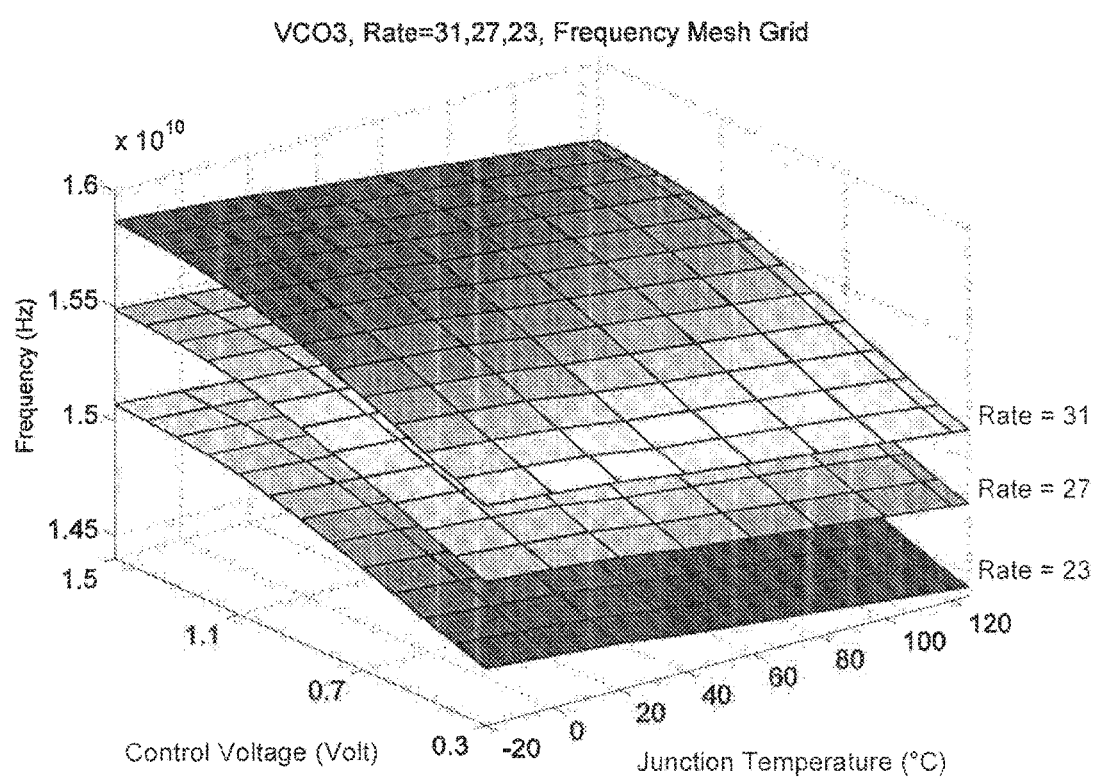
FIG. 7A shows an example of a four dimensional characterization dataset of a VCO characterized according to embodiments of the present disclosure.

FIG. 7A is an example of a four dimensional characterization dataset Only part of the data from the dataset is shown in FIG. 7A. Specifically, the characterization data relating to coarse-tuning control RATE settings having values of 23, 27, and 31 are shown for simplicity and clarity.

Referring back to FIG. 6, at step 204, a frequency polynomial function is determined for each coarse-tuning control RATE setting. According to an embodiment, determining the frequency polynomial function comprises first, generating a three dimensional surface from the four dimensional characterization dataset, and second, fitting the frequency polynomial function to the three dimensional surface.

Selecting a given coarse-tuning control RATE setting from the four dimension of characterization dataset reduces the dataset to three dimensions and creates the three dimensional surface for the given coarse-tuning control RATE.

Figure 7B:
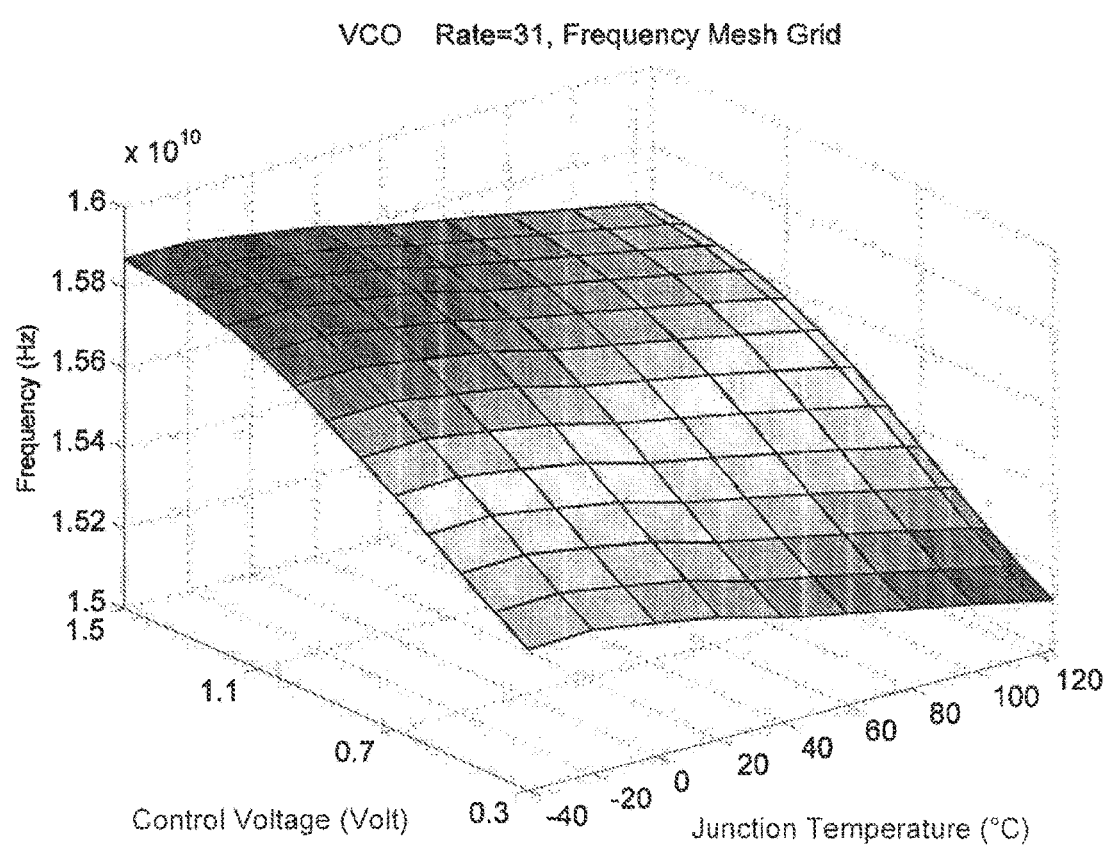
FIG. 7B shows a three dimensional (3-D) surface generated torn the characterization data of FIG. 7A and describing frequency characteristics of an example VCO versus temperature and control voltage.

FIG. 7B is an example of a three dimensional surface according to an embodiment of the present disclosure. The three dimensional surface represents frequency as a function of $V_C$ and $T_j$ for the given coarse-tuning control RATE setting. In the example of FIG. 7B, the RATE setting having value=31 is chosen. The three dimensional surface represents how the VCO frequency changes relative to both fine tuning control voltage and junction temperature.

Referring back to FIG. 6, fitting the polynomial expression to the three dimensional surface involves finding coefficients a, b, c, d, e, k for best polynomial fit $f(Y_C, T_j)=a, V_C^2+b, T_j^2+c, V_C, T_j+d, V_C+e, T_j+k$. Thus, the fitted polynomial expression mathematically models the empirical data of the three dimensional surface.

In order to determine frequency polynomial functions for each coarse-tuning control RATE setting, step 204 may be repeated for all available coarse-tuning control RATE settings. Thus, step 204 converts the four dimensional characterization dataset into a plurality of polynomial expressions, where each polynomial expression defines a relationship for modelling frequency as a function of $V_C$ and $T_j$ for a given coarse-tuning control RATE setting, and the plurality of polynomial expressions covers all of the different coarse-tuning control RATE settings available to the VCO 120.

At step 206, a range of usable frequency contours is determined for each coarse-tuning control RATE setting. A contour is a curve in the polynomial expression of 204, where the curve represents a constant frequency for varying fine tuning control voltage and junction temperature. This determination mew be made using numerical methods (e.g. the contour function in Matlab® software, or other similar functions) to identify frequency contours, on each setting of coarse-tuning digital control input RATE, that satisfy certain criteria.

Figure 7C:
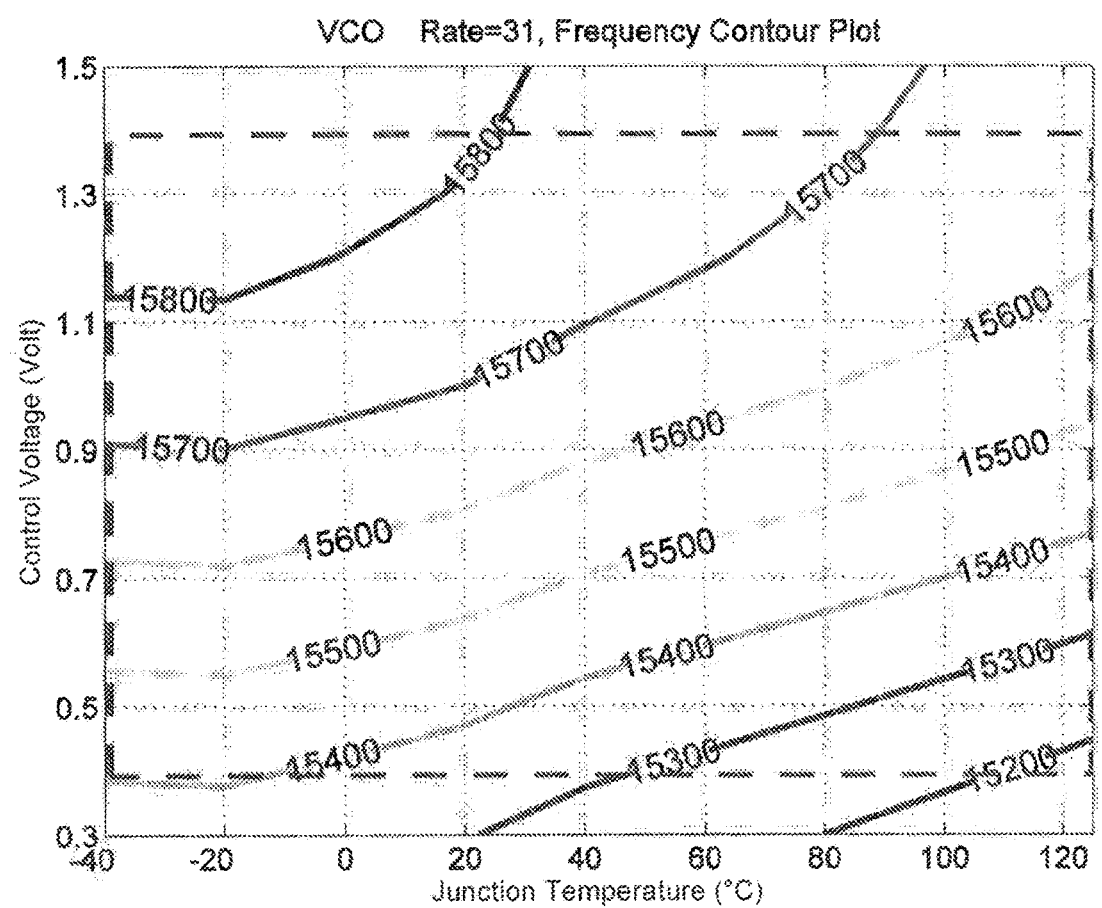
FIG. 7C shows contour plots of constant-frequency cross sections of the 3-D surface of FIG. 7B.

FIG. 7C is an example of a plurality of frequency contours of a given coarse-tuning control RATE setting. The contour lines of FIG. 7C represent frequencies of 15,800 MHz, 15,700 MHz, 15,800 MHz, 15,500 MHz, 15,400 MHz, 15,300 MHz, and 15,200 MHz.

In mathematical terms, frequency f is a 2-variable function of $T_j$ and $V_C$, i.e. $f=f(T_j, V_C)$, and the closed-loop PLL system forces the following partial differential equation to ensure constant-frequency operation:

$$\frac{\partial f}{\partial T_i} \cdot \Delta T_j + \frac{\partial f}{\partial V_C} \cdot \Delta V_C = 0 \qquad \text{Equation 4}$$

where $\Delta T_j$ and $\Delta V_C$ are incremental changes in junction temperature and fine tuning control voltage around their respective operating points. The contour lines of FIG. 7C provide a fairly clear picture of capabilities and limits of a given VCO on a given coarse-tuning control RATE setting. For instance, it can be shown below that contour lines corresponding to VCO frequencies of 15,500 MHz, and 15,600 MHz cover the whole temperature range of −40° C.≤$T_j$≤125° C. while their corresponding control voltages are bounded In allowable control voltage range of 0.4V≤$V_C$≤1.4V, as shown by the dashed box line in FIG. 7C.

The criteria for determining the range of usable frequency contours involve finding a contour(s) that: (i) covers the functional temperature range of interest, i.e. $T_{min}$≤$T_j$≤$T_{max}$; and (ii) lies within the allowable range of fine-tuning control voltage, i.e. $V_{min}$≤$V_C$≤$V_{max}$ as previously set forth above, in the example of FIG. 7C, the contour lines for 15,600 MHz, 15,500 MHz, and 15,400 MHz cover the functional temperature range of Interest from −40° C. to 125° C. The contour lines for 15,800 MHz, 15,700 MHz, 15,300 MHz, and 15,200 MHz fail to cover the functional temperature range of Interest.

Further, only the contour lines for 15,600 MHz and 15,500 MHz lie within the allowable range of fine-tuning control voltage from 0.4 V to 1.4 V; the 15,400 MHz contour line, which covers the temperature range of interest, does not, however, lie wholly within the allowable range of control voltage. Therefore, only 15,600 MHz and 15,500 MHz contour lines satisfy the above criteria.

Although the example of FIG. 7C only shows contour lines in 100 MHz increments, in embodiments of the present disclosure, contour lines may be created at smaller increments to increase number of contour lines and increase the granularity of step 206.

Figure 7D:
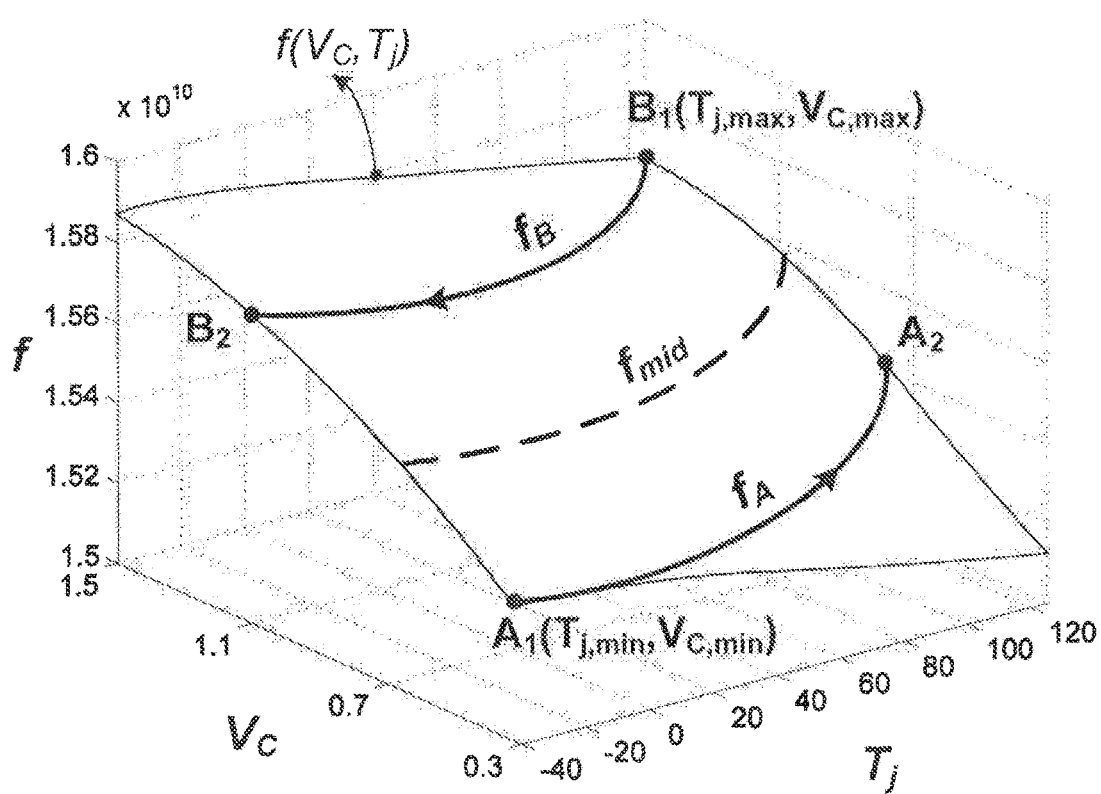
FIG. 7D shows an example average usable frequency contour $f_{mid}$ on a 3-D surface describing frequency characteristics of an example VCO.

FIG. 7D is an example of minimum and maximum usable frequency contour lines. The minimum and maximum usable frequencies for a given coarse-tuning control RATE setting can be determined as follows.

For the minimum usable frequency;

1. Find the frequency value $f_A=f(T_{j,min}, V_{C,min})$ corresponding to the point $A_1$ that represents $(T_{j,min}, V_{C,min})$.

2. Build the equation $f(T_{j,max}, V_{A2})-f_A=0$ and solve it to find $V_{A2}$, which is the fine-tuning control input voltage corresponding to point $A_2$ located at temperature $T_{j,max}$.

3. If the resultant $V_{A2}$ voltage meets the criteria $V_{C,min}$≤$V_{A2}$≤$V_{C,max}$, then the VCO at the given coarse-tuning control RATE setting can tolerate the specified temperature drift from $T_{j,min}$ to $T_{j,min}$ within the allowable control voltage range in this case, $f_A=f(T_{j,min}, V_{C,min})$ will the minimum usable frequency of the given coarse-tuning control RATE setting.

If, at the given coarse-tuning control RATE setting, resultant $V_{A2}$ voltage falls outside of the range from $V_{C,min}$ to $V_{C,max}$, then the method 200 may determine that the given coarse-tuning control RATE setting is invalid or non-operable. The method 200 may optionally further comprise disabling the given coarse-tuning control RATE setting and returning a warning about the same.

For the maximum usable frequency:

1. Find the frequency value $f_B=f(T_{j,max}, V_{C,max})$ corresponding to the point $B_1$ that represents $(T_{j,max}, V_{C,max})$.

2. Build the equation $f(T_{j,min}, V_{B2})=f_B=0$ and solve it to find $V_{B2}$, which is the fine-tuning control input voltage corresponding to point $B_2$ located at $T_{j,min}$.

3. If for the resultant $V_{B2}$ voltage meets the criteria $V_{C,min}$≤$V_{B2}$≤$V_{C,max}$, then the VCO at the given coarse-tuning control RATE setting can tolerate the specified temperature drift from $T_{j,max}$ to $T_{j,min}$ within the allowable control voltage range. In this case, $f_B=f(T_{j,max}, V_{C,max})$ will be the maximum usable frequency of the given coarse-tuning control RATE setting.

If at the given coarse-tuning control RATE setting, resultant $V_{B2}$ voltage falls outside of the range from $V_{C,min}$ to $V_{C,max}$, then the method 200 may determine that the given coarse-tuning control RATE setting is invalid or non-operable. The method 200 may optionally further comprise disabling the given coarse-tuning control RATE setting and returning a warning about the same.

A possible reason why the controller 104 is unable, at 206, to determine any usable frequency contours in the frequency polynomial expression of a given coarse-tuning control RATE setting, is that the VCO on that RATE setting does not have sufficient frequency gain to compensate for frequency changes caused by junction temperature drift. Since disabling one or more coarse tuning control RATE settings of the VCO reduces the overall FTR of the VCO, it may be desirable to design the VCO so that the VCO always has enough gain, at each coarse tuning control RATE setting, to compensate for frequency changes caused by changing operational conditions such as temperature.

In summary, the dashed box in FIG. 7C shows the specified operating limits with respect to $V_C$ and $T_j$. The usable contours, meeting the above-mentioned two criteria, are those that cross the right and left sides of the box, but not the top and bottom sides. The usable contour plots (15,800 MHz and 15,500 MHz) suggest an approximate nonlinear relationship between junction temperature $T_j$ and the corresponding fine tuning control voltage $V_C$ at constant VCO frequencies for a given coarse-tuning control RATE setting. A $2^{nd}$-order polynomial is a good fit to define the relationship between junction temperature $T_j$ and the fine tuning control voltage $V_C$, although higher-order approximations can be used if more accuracy is justified.

Referring back to FIG. 6, at step 208, a fine-tuning control voltage function $V_{cal}(T_j)$ is determined for each coarse-tuning control RATE setting available to the VCO. Determining the fine-tuning control voltage function $V_{cal}(T_j)$ is based on an average usable frequency and a corresponding frequency contour. Therefore, the voltage function $V_{cal}(T_j)$ relates to a nominal control voltage corresponding to the average usable frequency. As will be clear below, this nominal control voltage is not necessarily the fine tuning control voltage used during normal operation of the VCO for generating a clock signal having a desired frequency.

In the example of FIG. 7D, the average usable frequency for any particular RATE setting is represented by the $f_{mid}$ frequency contour as shown. The $f_{mid}$ frequency contour also represents the voltage function $V_{cal}(T_j)$; for any junction temperature In the range of interest, the voltage function $V_{cal}(T_j)$ will identify the corresponding fine-tuning control voltage to generate the average usable frequency.

The average usable frequency may be calculated by averaging the minimum usable frequency $f_A$ and the maximum useable frequency $f_B$ determined above: $f_{mid}(f_A+f_B)/2$. The average usable frequency has a corresponding contour, which is well-centered in the three dimensional frequency surface of the given coarse-tuning control RATE setting, and which satisfies the fine tuning control voltage and junction temperature criteria set out above.

A contour is considered well-centered in frequency if the contour is closest to the average frequency of all frequencies that meet criteria (i) and (ii) above in reference to FIG. 7C. A contour is considered well-centered over the control voltage range if the contour is most centered around the middle of the allowable control voltage range $[(V_{min}+V_{max})/2]$. Centering around the middle of the allowable control voltage range helps to achieve best linear performance of the circuitry driving the VCO in closed loop PLL system (e.g. charge pump).

The contour corresponding to the average usable frequency $f_{mid}$ defines the voltage function $V_{cal}(T_j)$. The function $V_{cal}(T_j)$ may be an analytic expression or a numerical look-up table. In an embodiment. $V_{cal}(T_j)$ may be quantized to the accuracy of an on-die DAC used for setting a voltage on the fine-tuning input of the VCO, or to the accuracy of an external voltage source or external DAC used for setting a voltage on the fine-tuning input of the VCO during start-up calibration.

Steps 204, 208, and 208 generally comprise a pre-calibration processing operation 220 for generating a plurality of calibration functions. In this embodiment, the calibration functions are the voltage functions $V_{cal}(T_j)$ generated at step 208.

Referring back to FIG. 6, at step 210, the sensor 106 measures the junction temperature with the VCO placed in an open-loop state. At step 212, a fine tuning control voltage corresponding to the average frequency of each RATE setting is calculated from the voltage function $V_{cal}(T_j)$ of each RATE setting and the measured junction temperature.

At step 214, the controller 104 sweeps through all of the VCO's coarse-tuning control RATE settings while applying the calculated control voltage to the VCO's VCTRL input 108. This causes the VCO output to change in discrete frequency jumps. At each coarse-tuning control RATE setting of the sweep, the controller 104 measures the difference between the frequency of the VCOCLK output 112, and the target frequency of the VCOCLK based on the frequency of a reference signal, which represents a desired frequency.

At step 216, the controller 104 selects the coarse-tuning control RATE setting that minimizes the measured frequency difference in 214. The controller 104 provides the value of the selected coarse-tuning control RATE setting to the VCO.

Steps 210 to 216 generally comprise a start-up calibration operation 222. The start-up calibration operation combines the sensor measurement value with the calibration functions generated from operation 220 in order to select a calibration setting and output a calibration setting signal or voltage.

The method 200 may also optionally comprise a closed-loop operation at step 218. Either the controller 104 or a system operating the VCO adjusts the fine tuning control voltage, which was previously a fixed voltage based on the polynomial calculations. The fine tuning control voltage may be adjusted by either increasing or decreasing the control voltage to minimize the difference between the frequency of the VCOCLK output 112 and the desired frequency based on the reference signal. Adjusting the fine tuning control voltage at 218 may also include configuring the VCO for closed-loop operation, e.g. within a PLL system, which continuously (dynamically) re-adjusts the control voltage in order to minimize the error (difference) between the frequency of the VCOCLK output 112 and the desired frequency based on the reference signal.

In practical VCO applications, junction temperature variations impact the frequency of the VCO. For a VCO in a closed-loop system configuration, the feedback loop compensates these temperature variations by continuously adjusting the fine tuning control voltage of the VCO to keep the output frequency at the desired constant.

However, before the feedback loop can lock the VCO to the desired frequency, the VCO is typically correctly calibrated.

Accordingly, the VCO calibration method 200 calibrates the VCO at the correct fine tuning control voltage, defined by $V_{cal}(T_j)$, corresponding to the junction temperature measured at calibration. In order for the VCO to generate a clock signal having the desired frequency. The function $V_{cal}(T_j)$ is defined by a contour plot well-centered in frequency for a given coarse-tuning control RATE setting, in contrast, known approaches merely calibrate the VCO at midrail control voltage of $V_{cal}=\frac{1}{2} V_{DD}$, irrespective of calibration temperature, thereby constraining the control voltage range and compromising the tolerable temperature drift in post-calibration.

In some embodiments; the VCO calibration method 200 may be improved by separately optimizing the method for various device manufacturing process corners. These corners in a CMOS process are known as Typical NMOS/Typical PMOS (TT), Slow NMOS/Slow PMOS (SS), Fast NMOS/Fast PMOS (FF), Slow NMOS/Fast PMOS (SF), and Fast NMOS/Slow PMOS (FS). In particular, steps 202 to 208 of the method to generate a temperature-dependent calibration voltage $V_{cal}(T_j)$ can first be executed separately over process-dependent datasets collected from either circuit simulations or lab measurements. During the start-up calibration 222, if the process information is available (e.g. stored in electronic fuses (eFuse) on the device burnt at production time, or through designated on-die hardware for process monitoring), then the calibration method 200 can pick the temperature-dependent calibration formula associated with the given manufacturing process corner, in the preceding and following disclosure, for the sake of simplicity, we describe example calibration methods independent of any manufacturing process corner, thus implying a Typical (TT) process. However, it would be known by the skilled person that other process corners, both listed above and otherwise, can be applied to the embodiments of the present disclosure.

In some embodiments, the VCO calibration method comprises an optimization method for generating the fine-tuning control voltage function $V_{cal}(T_j)$ for each coarse tuning RATE setting. The fine-tuning control voltage function $V_{cal}(T_j)$ is a $2^{nd}$-order polynomial that defines the VCO's fine tuning control voltage as a function of junction temperature. The optimization method may minimize or reduce a cost function in order to make the center of the range of all control voltages that generate a constant target frequency over all temperatures as close as possible to the center of the allowable control voltage range. Consequently, the optimization method may inherently result in the fine-tuning control voltage function being well-centered in the fine tuning control voltage range. In comparison to the embodiment of the calibration method 200 discussed above, a two-variable polynomial function for modelling a three-dimensional surface is not explicitly derived in this embodiment. An example method according to this embodiment is described below.

Figure 8:
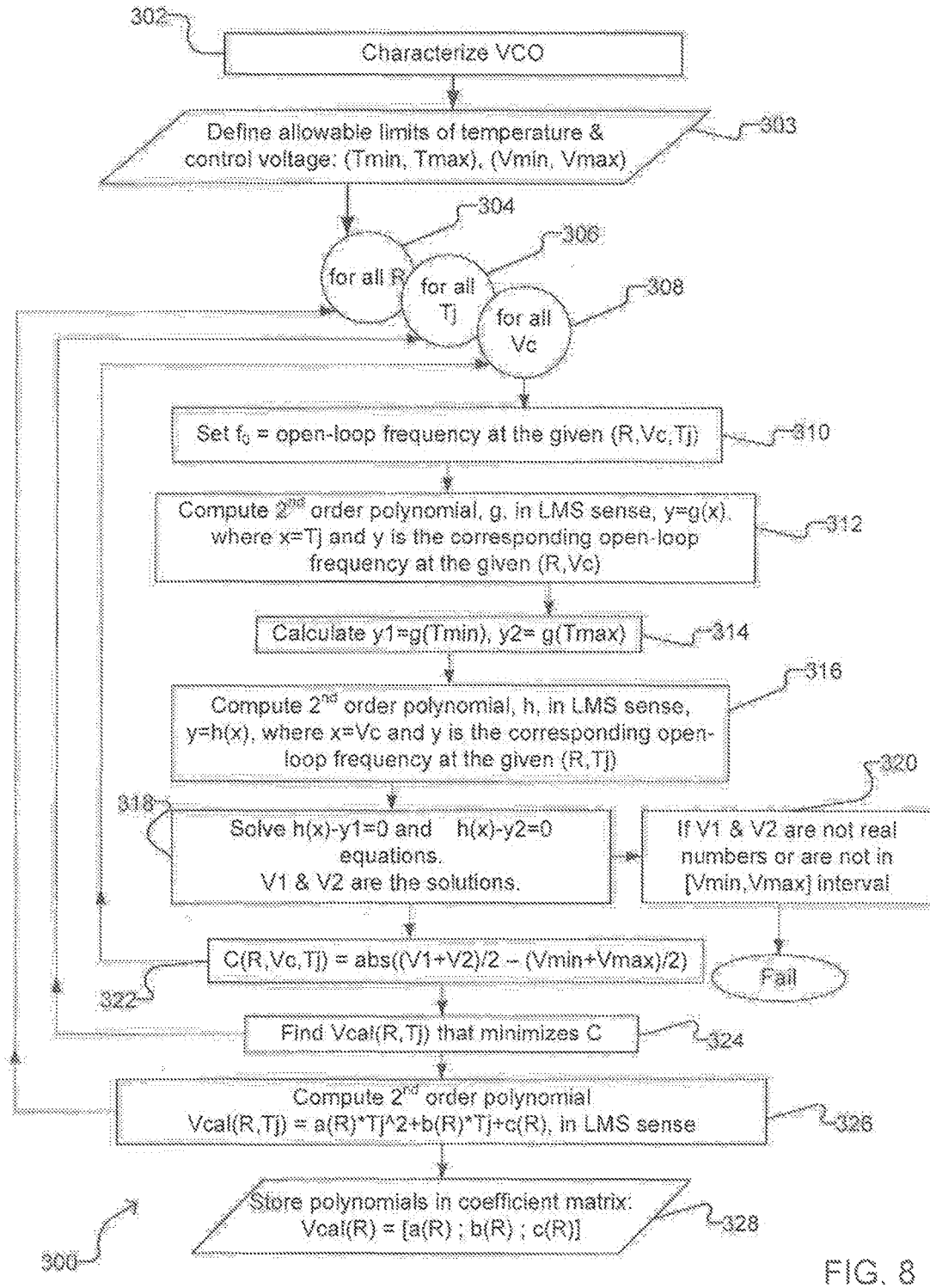
FIG. 8 is a flowchart illustrating steps of an example optimization method for defining VCO calibration voltage versus temperature.

FIG. 8 shows an example method for calibrating the VCO 102. In particular, FIG. 8 is a flowchart diagram of an optimization method 300 to generate polynomial coefficients that define the VCO calibration voltage according to an embodiment of the present disclosure. The method 300 may be performed by the controller 104. Alternatively, in other embodiments, some steps of the method 300 may be performed externally of the controller 104 and the controller 104 stores the processed data from those steps performed externally and performs the start-up calibration operation 222.

At step 302, the VCO 102 under test is characterized, in an embodiment, the VCO 102 is a VCO with an inductor-capacitor bank comprising a plurality of discrete switchable capacitors.

The VCO 102 has positive VCO gain (that is, frequency f monotonically increasing versus fine tuning control voltage $V_C$) and negative temperature coefficient (that is, frequency f monotonically decreasing versus junction temperature $T_j$). The VCO frequency may vary monotonically with changes in each of the one or more operational conditions. Characterizing the VCO involves gathering data that is representative of these frequency changes of the VCO versus operational conditions, control voltage and capacitor bank setting.

Characterizing the VCO at 302 may be done from model simulations or lab measurements by sweeping all possible values of the fine tuning control voltage $V_C$, the junction temperature $T_j$, and the coarse-tuning control RATE setting R, and recording the output frequency f of the VCO output signal VCOCLK, Characterizing the VCO generates a set of data having relationships in tour-dimensions, fine tuning control voltage $V_C$, the junction temperature $T_j$, the coarse-tuning control RATE setting, and output frequency f.

At 303, the allowable limits of temperature and control voltage are defined for the VCO 102, These limits may be stored as parameters Tmin, Tmax and Vmin, Vmax.

At 304, a first nested loop performs steps 306 to 328 for all coarse-tuning control RATE settings of the VCO 102. At 306, a second nested loop performs steps 308 to 324 for all junction temperatures characterized for the VCO 102. At 308, a third nested loop performs steps 310 to 322 for all fine tuning control voltages characterized for the VCO 102.

At step 310, for a given coarse-tuning control RATE setting R, fine tuning control voltage $V_C$, and junction temperature $T_j$, the controller 104 stores an initial frequency $f_0 = f(R, V_C, T_j)$.

At step 312, the controller 104 generates a first $2^{nd}$ order polynomial for the given coarse-tuning control RATE setting R and fine tuning control voltage $V_C$. The $2^{nd}$ order polynomial is fit to all frequency deviations of $f_0$ caused by temperature changes using the VCO characterization data of step 302, According to an embodiment of the present disclosure, the polynomial curve is fit using a least-mean-square (LMS) error estimation method.

At step 314, the controller 104 determines VCO frequencies y1 and y2 based on the polynomial expression generated at 312. The y1 frequency is an estimate of the VCO frequency corresponding to a minimum junction temperature (again, for the given coarse-tuning control RATE setting R and fine tuning control voltage $V_C$). The y2 frequency is an estimate of the VCO frequency corresponding to a maximum junction temperature (for the given coarse-tuning control RATE setting R and fine tuning control voltage $V_C$).

At step 316, the controller 104 generates a second $2^{nd}$ order polynomial for the given coarse-tuning control RATE setting R and junction temperature $T_j$. The $2^{nd}$ order polynomial is fit to all frequency deviations of $f_0$ caused by control voltage changes According to an embodiment of the present disclosure, the polynomial curve is fit using a least-mean-square (LMS) error estimation method.

At step 318, the controller 104 determines VCO control voltages $V_1$ and $V_2$ based on the polynomial expression generated at 316. The voltage $V_1$ represents the fine tuning control voltage value suitable to compensate for worst-case frequency deviations caused by temperature decrease to $T_{min}$, where the VCO is calibrated at the given conditions (R, $V_C$, $T_j$) of the nested loop instance. The voltage $V_2$ represents the fine tuning control voltage value suitable to compensate for worst-case frequency deviations caused by temperature increase to $T_{max}$, where the VCO is calibrated at the given conditions (R, $V_C$, $T_j$) of the nested loop instance.

According to an embodiment, step 318 comprises finding a fine tuning control voltage $V_C$ that satisfies equations $f(R, V_1, T_{min}) - f_0 = 0$ and $f(R, V_2, T_{max}) - f_0 = 0$ hereinafter referred to as Local Temperature Compensation (LTC) equations. $V_1$ and $V_2$ are solutions to the LTC equations and are functions of R, $T_j$, and $V_C$, i.e., $V_1 = u(R, V_C, T_j)$ and $V_2 = w(R, V_C, T_j)$.

If solutions to $V_1$ and $V_2$ do not exist in the allowable control voltage range, $[V_{min} \leq V_C \leq V_{max}]$, the method stops at step 320 and the calibration is unsuccessful. The controller 104 may output a calibration failure message. In response to the failure message, the VCO may be reconfigured, for example, by increasing the VCO's gain, $K_{VCO}$, thus allowing a tradeoff to find a solution to $V_1$ and $V_2$ in the allowable range but with a potentially degraded phase noise performance. Note that if the VCO is reconfigured to change its $K_{VCO}$, then new characterization data corresponding to the new $K_{VCO}$ may be required as the Input to the method 300. Then method 300 may be repeated. Alternatively, another attempt may be made at finding the calibration polynomial coefficients by relaxing the allowable range of temperature or control voltage, i.e, reduce the specified temperature range $[T_{min} \leq T_j \leq T_{max}]$ or expand the allowable control voltage range $[V_{min} \leq V_C \leq V_{max}]$, then repeat the method 300 starting at step 303.

For a given coarse-tuning control RATE setting R and junction temperature $T_j$, the voltages $V_1$ and $V_2$ are functions of the given control voltage $V_C$ of the instant nested loop. At step 322, the controller 104 calculates a cost function based on the difference between the midpoint of $V_1$ & $V_2$ with respect to the center of the allowable fine tuning control voltage range $[V_{min} \ldots V_{max}]$.

At step 324, the cost function of 322 is minimized to find the optimum calibration voltage $V_{cal}$ at the given coarse tuning control RATE setting and junction temperature $T_j$ of the nested loops. In particular, the calibration voltage $V_C = V_{cal}$ minimizes the following cost function:

$$C(R, V_C, V_1, V_2, T_j) = \text{abs}\left(\frac{(V_1 + V_2)}{2} - \frac{(V_{min} + V_{max})}{2}\right) \quad \text{Equation 5}$$

where abs(.) denotes an absolute value function.

In other words, step 324 solves the following optimization problem. For a given set of coarse-tuning control RATE setting R and junction temperature $T_j$, find optimum calibration voltage $V_C = V_{cal}$ that minimizes cost function of Equation 5 (i.e., $\min_{V_C} C(R, V_C, V_1, V_2, T_j)|_{(R,T_j)} > V_{cal}$), subject to: $V_1 = u(R, V_C, T_j)$; $V_2 = w(R, V_C, T_j)$; $T_{min} \leq T_j \leq$ $T_{max}$; $V_{min} \leq V_C \leq V_{max}$, where u(.) & w(.) are the solutions of LTC equations at $T_{min}$ & $T_{max}$ (extreme allowed temperatures), respectively.

At step 326, a curve (e.g., a $2^{nd}$ or higher order polynomial) is fit to the optimum calibration voltage points versus different junction temperatures. In most applications, a $2^{nd}$-order polynomial is sufficient for this fitting with regard to a practical accuracy for adjusting the VCO's calibration voltage. In other embodiments, higher order polynomials could be employed, if desired. Polynomials of $2^{nd}$ order or higher are generated for each coarse-tuning control RATE setting available in the characterization dataset.

Finally, at step 328, the controller 104 stores each of the polynomials of 328 for calibrating the VCO.

As explained above, the method 300 generates a $2^{nd}$ order (or higher order) polynomial $V_{cal}(T_j)$ for each coarse-tuning control RATE setting. Steps 202 to 208 of method 200 also generate a polynomial function $V_{cal}(T_j)$, but according to a different approach. Therefore, method 300 may also include additional steps to perform complete calibration of the VCO. Specifically, the method 300 may include similar steps to 210, 212, 214, and 216 of method 200 discussed above in order to complete the start-up calibration operation 222. The method 300 may also optionally include a similar step to 218 of method 200 to perform closed-loop operation.

If the VCO has a large number of coarse-tuning control RATE settings (e.g. 32, 64, or 128), the size of the on-chip memory necessary to store all polynomial coefficients accurately may become prohibitive. Therefore, in practice, it may be desirable to relax the accuracy of the polynomial fits for specific coarse-tuning control RATE settings, and instead use a common polynomial for a cluster of coarse-tuning control RATE settings in order to save on the memory size requirements for storing the polynomials' coefficients. A post-processing method may be used to generate common polynomials for clusters of the RATE settings.

Figure 9:
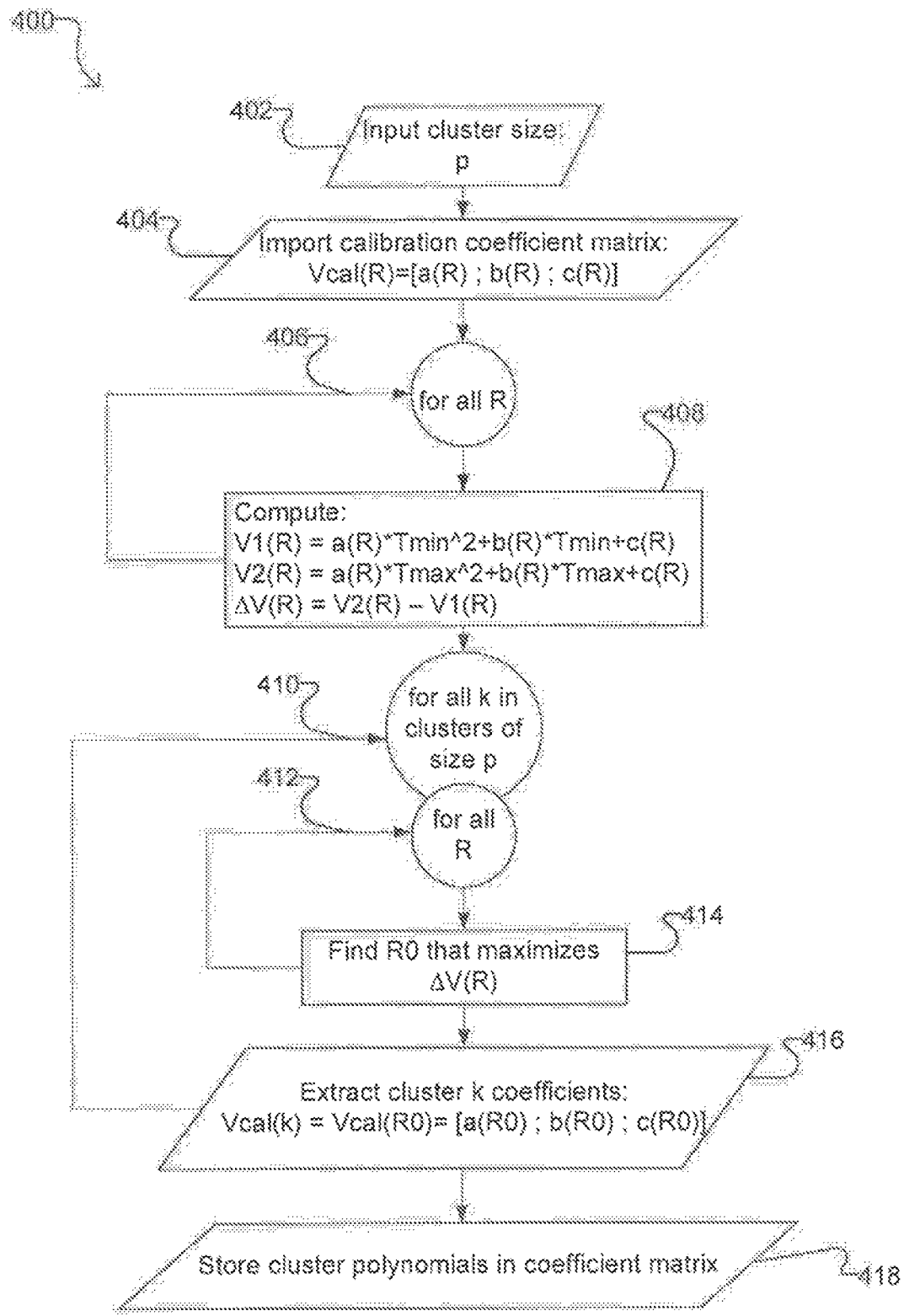
FIG. 9 is a flowchart illustrating steps of an example post-processing method for defining VCO calibration voltage versus temperature for a RATE cluster.

FIG. 9 is a flowchart diagram of an embodiment of a method 400 for clustering coarse-tuning control RATE settings. At step 402, a desired cluster size p is selected. The cluster size parameter indicates how many coarse-tuning control RATE settings are to be merged into one cluster in order to share a common calibration polynomial. This is a tradeoff between calibration accuracy and on-chip memory requirements to store the calibration coefficients.

At step 404, the polynomial coefficients for each coarse-tuning control RATE setting are imported, for example in a matrix, with each row of the matrix representing the set of coefficients {a, b, c} corresponding to polynomial expression $V_{cal}(T_j) = a.T_j^2 + b.T_j + c$ for a given coarse-tuning control RATE setting.

At 408, a loop iterates through the coarse-tuning control RATE settings according to the chosen cluster size.

At step 408, for each coarse-tuning control RATE setting (R), the value of the fine tuning control voltage range $\Delta V(R) = V_2(R) - V_1(R)$ is calculated (see $(V_2-V_1)$ in FIG. 4B).

After determining the control voltage range $\Delta V(R)$ for all values of coarse-tuning control RATE setting (R), the method proceeds to nested loops 410 and 412 to iterate through each cluster of size p (loop 410) and each coarse-tuning control RATE setting in that cluster (loop 412).

At step 414, within each cluster of size p, the coarse-tuning control RATE setting with the largest control voltage range $\Delta V(R)$ is identified. By virtue of using the largest control voltage range, this coarse-tuning control RATE setting covers (supersedes) the requirements of all coarse-tuning control RATE settings in the cluster. Therefore, the polynomial coefficients of this coarse-tuning control RATE setting will be used for the calibration of all coarse-tuning control RATE settings in the cluster.

At 416, polynomial coefficients for each cluster are extracted for the next Iteration until all clusters have been processed. Next, at 418 the cluster polynomials are stored in the coefficient matrix.

For a VCO similar to the one shown in FIG. 1, generally the higher $C_{Coarse}$ values set in the LC tank result in lower $K_{VCO}$ values (as per Equation 3) as well as lower VCO frequencies (as per Equation 1). The lower VCO frequency settings are denoted with lower coarse tuning RATE settings in FIG. 4C. Also, coarse tuning RATE settings with the lowest $K_{VCO}$ may require the largest fine tuning control voltage range $\Delta V(R)$ to compensate for the same amount frequency shift $\Delta f$ due to temperature variations (see Equation 2).

Accordingly, the method 400 clusters multiple coarse tuning control RATE settings by using the polynomial coefficients of the lowest VCO gain setting for all settings, in other words, the method 400 uses the polynomial coefficients of the coarse tuning setting using the largest fine tuning control voltage range $\Delta V(R) = V_2(R) - V_1(R)$ for compensating a given temperature range.

Figure 10:
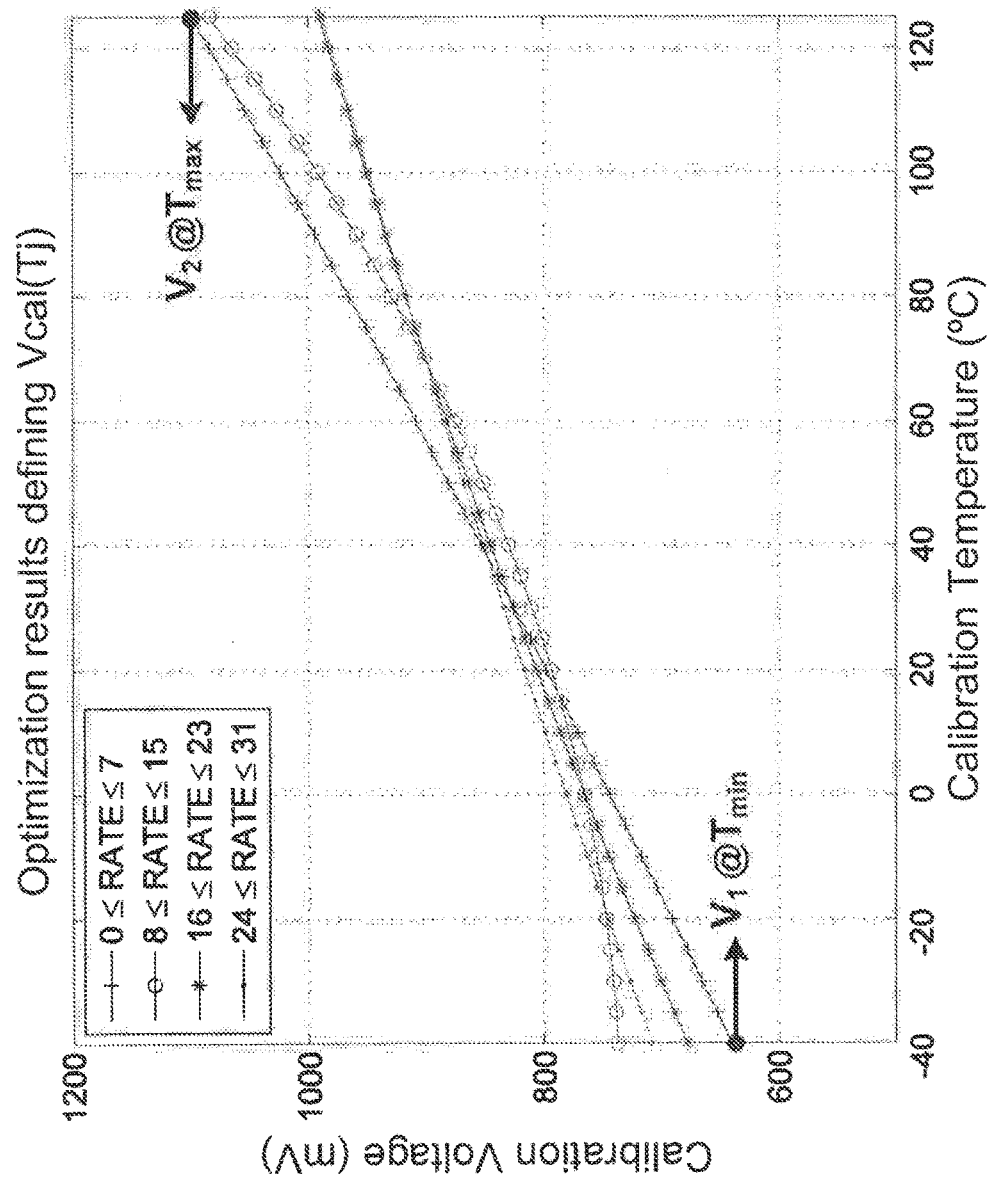
FIG. 10 shows optimization results defining calibration voltage versus temperature for different RATE clusters.

FIG. 10 is a graph showing VCO calibration voltage curves $V_{cal}(T_j)$ as a function of temperature for four example clusters according to method 400. Each cluster comprises 8 coarse-tuning control RATE settings. The coefficients for the polynomial expressions defining the calibration voltage for each cluster are shown in Table 1, below,

TABLE 1

| $V_{cal}(T_j) = a. T_j^2 + b. T_j + c$ | a | b | c |
|---|---|---|---|
| 0 ≤ RATE ≤ 7 | 0.001423 | 2.65618 | 744.028 |
| 8 ≤ RATE ≤ 15 | 0.011059 | 1.15922 | 765.677 |
| 16 ≤ RATE ≤ 23 | −0.002225 | 2.07921 | 765.293 |
| 24 ≤ RATE ≤ 31 | −0.00098621 | 1.779943 | 781.0881 | where $T_j$ is calibration temperature in degrees Centigrade (° C.), and $V_{cal}$ is the corresponding calibration voltage in millivolts (mV).

Voltage points $V_1$ and $V_2$, respectively, denote minimum and maximum fine tuning control voltages over junction temperatures extremes for coarse-tuning control RATE setting of value 0. The fine tuning control voltage tuning range (i.e., $V_2-V_1$) that may be required to compensate for the full operational temperature range (i.e., the temperature range shown on the x-axis) varies from one coarse tuning setting to another. FIG. 10 shows that the required fine tuning control voltage range is greatest for the RATE=0 to 7 cluster. The required fine tuning control voltage tuning range is smallest for the RATE=24 to 31 cluster. Within each cluster, the polynomial coefficients of the cluster are a better fit for certain coarse tuning settings (i.e., RATE values) than other coarse tuning settings.

In the example of FIG. 10, the polynomial corresponding to the RATE=0 to 7 cluster is sub-optimal for the coarse-tuning settings of RATE=1 to 7. Similarly, the polynomial corresponding to the RATE=24 to 31 cluster is sub-optimal for the coarse-tuning settings of RATE=25 to 31.

A sub-optimal calibration polynomial for the coarse tuning setting may result in a calibration that is not well-centered around the middle of the control voltage range, which can lead to higher nonlinearities (e.g., in a phase detector/charge pump driving the VCO's control voltage in a closed-loop PLL), hence increased noise in the system operating the VCO.

Therefore, selecting the cluster size at 402 of method 400 may compromise one aspect of the system performance for another. A larger cluster size (meaning a smaller number of clusters covering the various coarse tuning settings) reduces the memory size requirements of the controller 104 for storing various calibration polynomial coefficients, but may also increase the nonlinearity and noise in the system.

In the examples discussed above, temperature calibration is used to illustrate calibration methods according to the present disclosure. However, it is to be understood that the example methods presented with respect to temperature variation can be equally applied to supply voltage variation, moisture variation, or other operational conditions, and concurrently to combinations of two or more such operational conditions (e.g. both temperature and supply voltage variations).

Power Supply Voltage ($V_{DD}$)

In the VCO circuit of FIG. 1, an increase in $V_{DD}$ causes a decrease in VCO frequency; similarly, a decrease in $V_{DD}$ causes an increase in VCO frequency. For instance, a power supply increase in the VCO of FIG. 1 raises the common mode voltage on $V_+$ and V, and thus raises the average voltage across the fine-tuning varactors, which in turn increases their capacitance $C_{Fine}$, end hence decreases the VCO frequency, according to Equation 1.

VCO Calibration Based on Power Supply Voltage

The improved VCO calibration method described herein calibrates the VCO based on information about the VCO s power supply voltage at the time of calibration in order to maximize the tolerable range of supply voltage variations in a post-calibration phase of operation.

Figure 11:
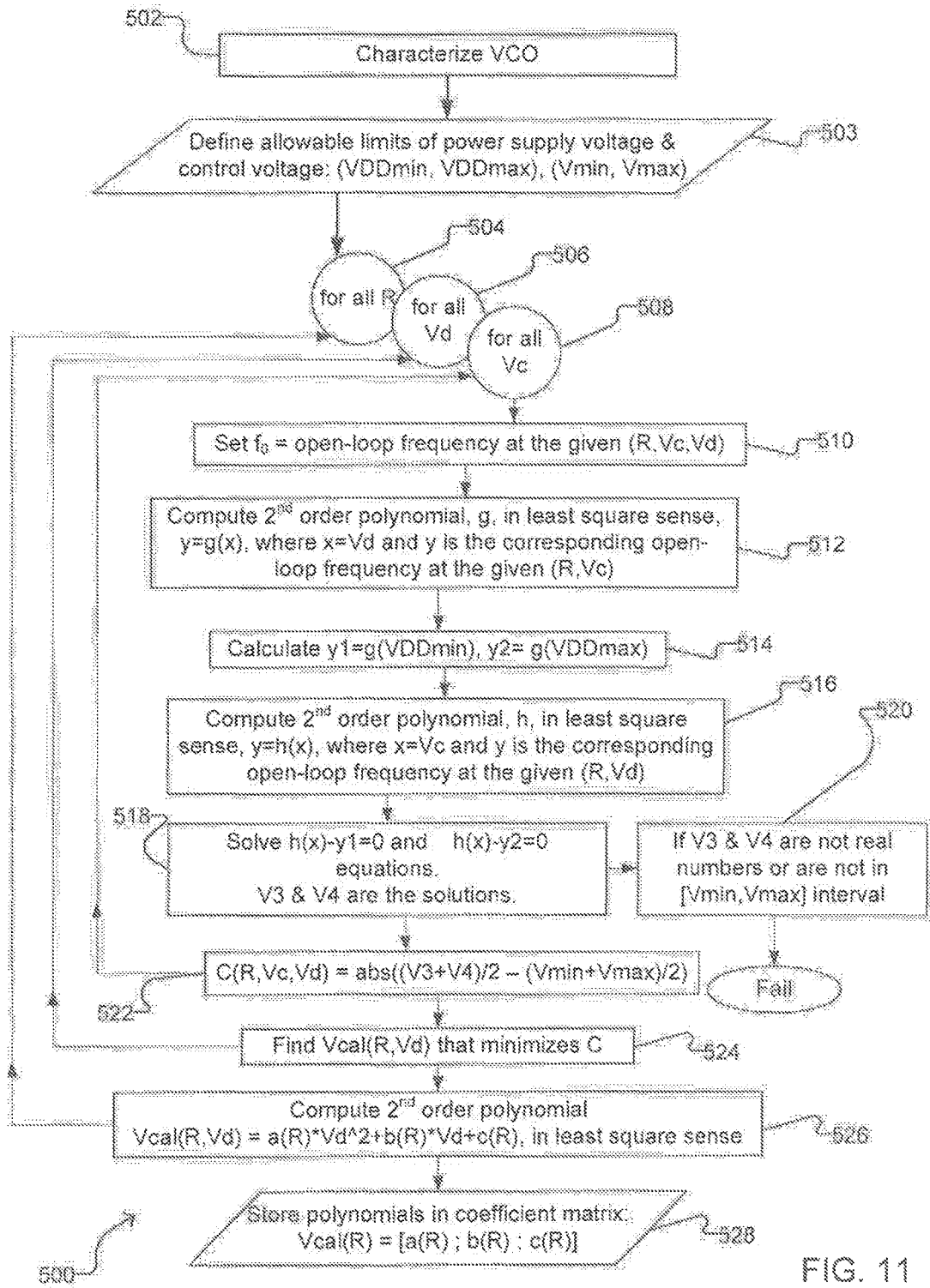
FIG. 11 is a flowchart illustrating steps of an example optimization method for defining VCO calibration voltage versus power supply voltage.

FIG. 11 shows an example method for calibrating the VCO 102 according to power supply voltage. In particular, FIG. 11 is a flowchart diagram of an embodiment of an optimization method 500 according to an embodiment of the present disclosure. The method 500 may be performed by the controller 104. The method 500 of FIG. 11 is similar to the method 300 of FIG. 8, except that power supply voltage $V_{DD}$ is used in place of junction temperature $T_j$. As such, the steps of method 600 are identified with like reference numerals as to those of method 300 and will not be described again in detail. At step 518, equations hereinafter referred to as Local $V_{DD}$ Compensation (LVC) equations are solved to find $V_3$ and $V_4$. For greater clarity, the equations shown in 518 of FIG. 11 may be re-written as: $f(R, V_3, V_{DD,min})-f_0=0$ and $f(R, V_4, V_{DD,max})-f_0=0$. The voltages $V_3$ and $V_4$ are functions of R, $V_d$, and $V_C$, i.e., $V_3=v(R, V_C, V_d)$ and $V_4=z(R, V_C, V_d)$, where $V_3$ & $V_4$ represent control voltages that may be used to compensate for frequency changes due to shifting to extreme supply voltages $V_{DD,min}$ & $V_{DD,max}$, respectively.

The cost function at step 522 is:

$$C(R, V_C, V_3, V_4, V_d) = \text{abs}\left(\frac{(V_3+V_4)}{2} - \frac{(V_{min}+V_{max})}{2}\right) \quad \text{Equation 6}$$

where abs(.) denotes absolute value function, $V_d$ is a variable showing the voltage value of the VCO's power supply $V_{DD}$. This cost function is minimized at step 524 to find the optimum calibration voltage $V_{cal}$ at that given coarse-tuning control RATE setting and power supply voltage.

Once the calibration voltage polynomials are defined, the VCO calibration method 500 may further include steps similar to 210, 212, 214, 216 of method 200 discussed earlier In order to complete the start-up calibration operation 222. The method 500 may also optionally include a similar step to 218 of method 200 to perform closed-loop operation. As explained above, the method 500 of FIG. 11 relates to VCO calibration based on supply voltage $V_{DD}$; FIG. 8 and FIG. 8 relate to VCO calibration based on junction temperature $T_j$. Thus, VCO calibration according to the optimization method 500 comprises steps similar to 210, 212, 214, 210, and 218 modified to measure power supply voltage $V_{DD}$ and apply $V_{cal}(V_{DD})$ to the VCO input.

Figure 12:
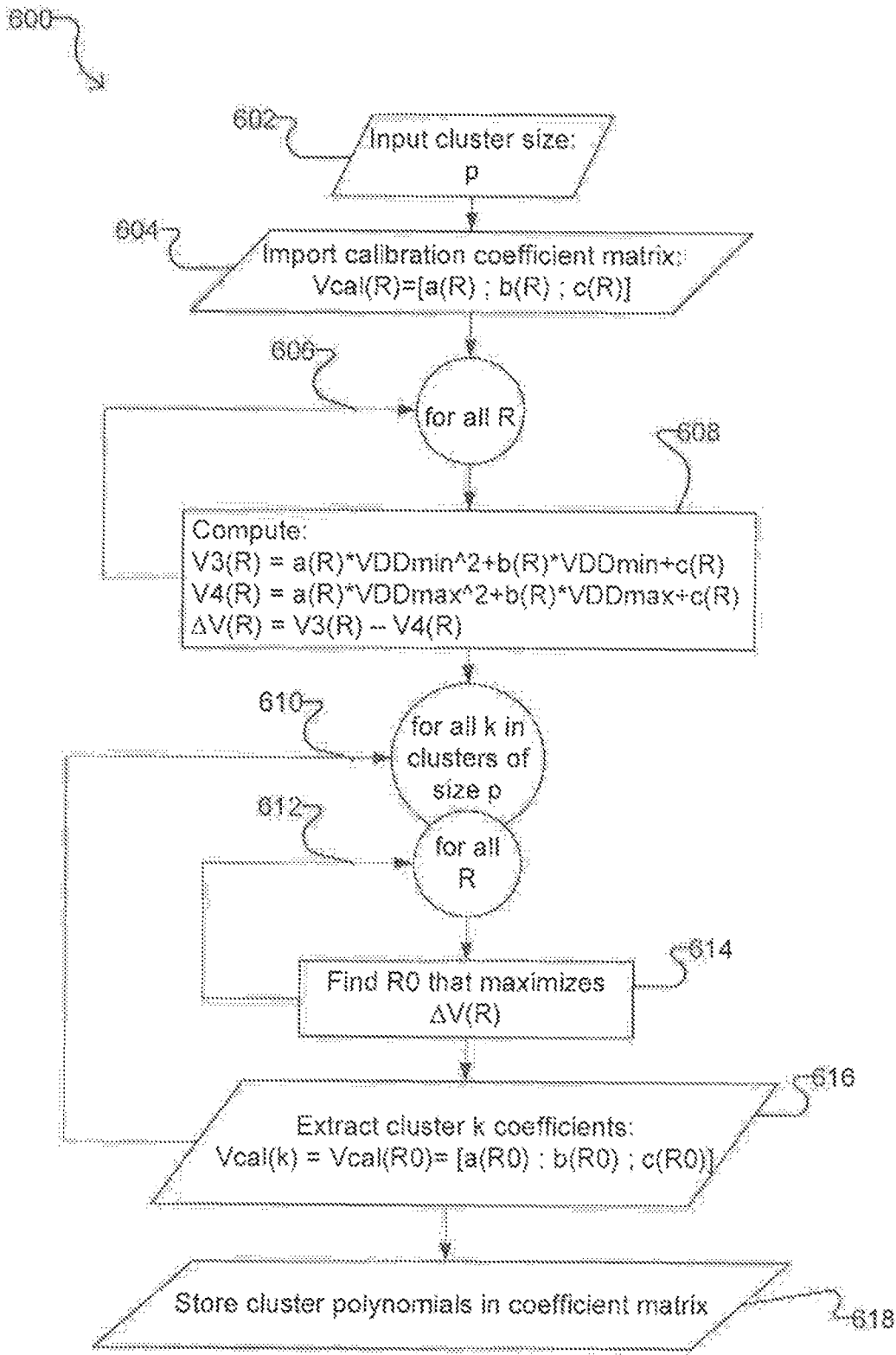
FIG. 12 is a flowchart illustrating steps of an example post-processing method for defining VCO calibration voltage versus power supply voltage for a RATE cluster.

FIG. 12 is a flowchart diagram of an embodiment of a method 800 for clustering coarse-tuning control RATE settings. The method 600 of FIG. 12 is similar to the method 400 of FIG. 3, except that allowable limits of power supply voltage $VDD_{min}$ and $VDD_{max}$ are used in place of allowable limits of junction temperature $T_{min}$ and $T_{max}$. As such, the steps of method 600 are identified with like reference numerals as to those of method 400 and will not be described again in detail.

Moisture Effect and VCO Calibration Based on Moisture Effect

Extreme increase in environmental humidity can cause moisture absorption in inter-metal dielectric in the silicon die, which can in turn increase the dielectric constant and the capacitance of MoM or MiM capacitors, leading to a slow-down in the VCO's oscillation frequency. However, this can be a long-term effect, and possibly triggered by reliability issues such as micro-cracks in the silicon die's metal seal ring, which would permit moisture into the silicon dielectric if moisture absorption occurs, a re-calibration of the VCO, e.g. using the start-up (run-time) calibration method of the present embodiments, can effectively compensate for the effect of capacitance change in the VCO. Specifically, on-die humidity data can be used by the calibration method described herein, in the same manner as the Information about temperature or supply voltage, to improve the VCO calibration.

Humidity or moisture data may be provided by an on-die humidity sensor comprising a capacitive sensor. The capacitive sensor may be implemented, for example, by a post-processing step to deposit a polyimide layer after a standard CMOS fabrication, where the sensing principle is the dielectric constant change of the polyimide due to absorption/desorption of water.

A Phase-Locked Loop System with VCO Calibration

Figure 13:
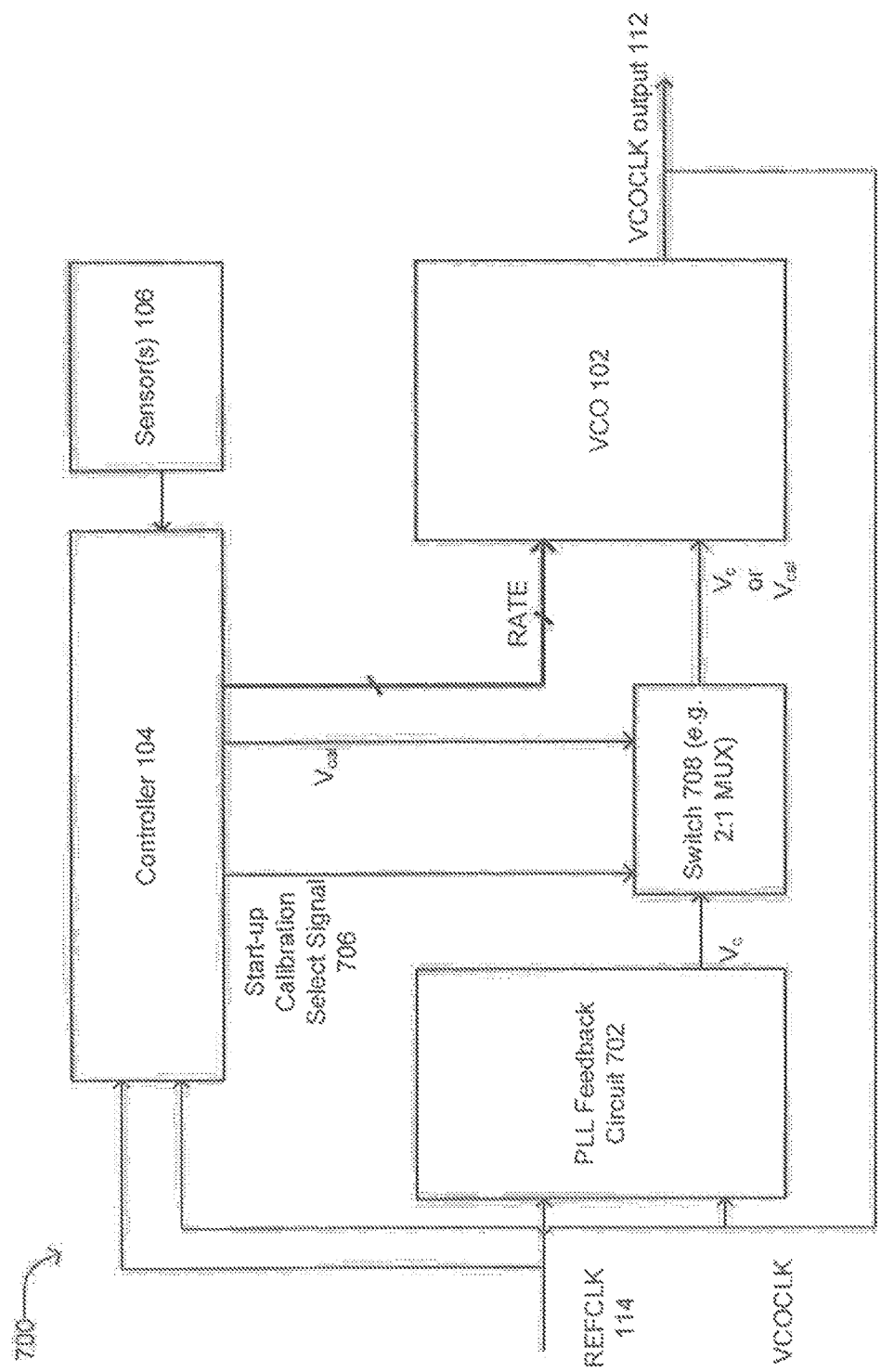
FIG. 13 is a block diagram of a phase-locked loop (PLL) according to an embodiment of the present disclosure.

FIG. 13 is a block diagram of a phase-locked loop (PLL) according to an embodiment of the present disclosure. The PLL 700 comprises a VCO 102, a controller 104, one or more sensors 106, a PLL feedback circuit 702, and a selector switch 708.

Calibrating the PLL 700, or the VCO 102 of the PLL 700, generally comprises configuring the PLL to operate in an open-loop start-up calibration mode, performing the calibration according to the various methods described above, and configuring the PLL to operate in normal closed-loop PLL mode using the determined calibration settings.

In post-calibration phase, while the PLL operates in the normal closed-loop mode, changes in operating conditions (such as temperature, supply voltage, and moisture) can cause the VCO to speed up or slow down. When this occurs, the PLL feedback circuit 702 may adjust the VCO's control voltage $V_C$ automatically using closed-loop feedback means to maintain the desired output frequency (typically, a frequency defined by REFCLK 114). The PLL remains locked and exhibits acceptable phase noise and jitter performance, as long the control voltage $V_C$ remains within its allowable range (i.e. $V_{min} \leq V_C \leq V_{max}$).

There is a very low probability that the PLL calibrated according to the embodiments of the present disclosure, described above, will require recalibration. Thus, the PLL may continue to operate in the normal closed-loop mode for a longer duration as compared to conventional PLLs.

Figure 14:
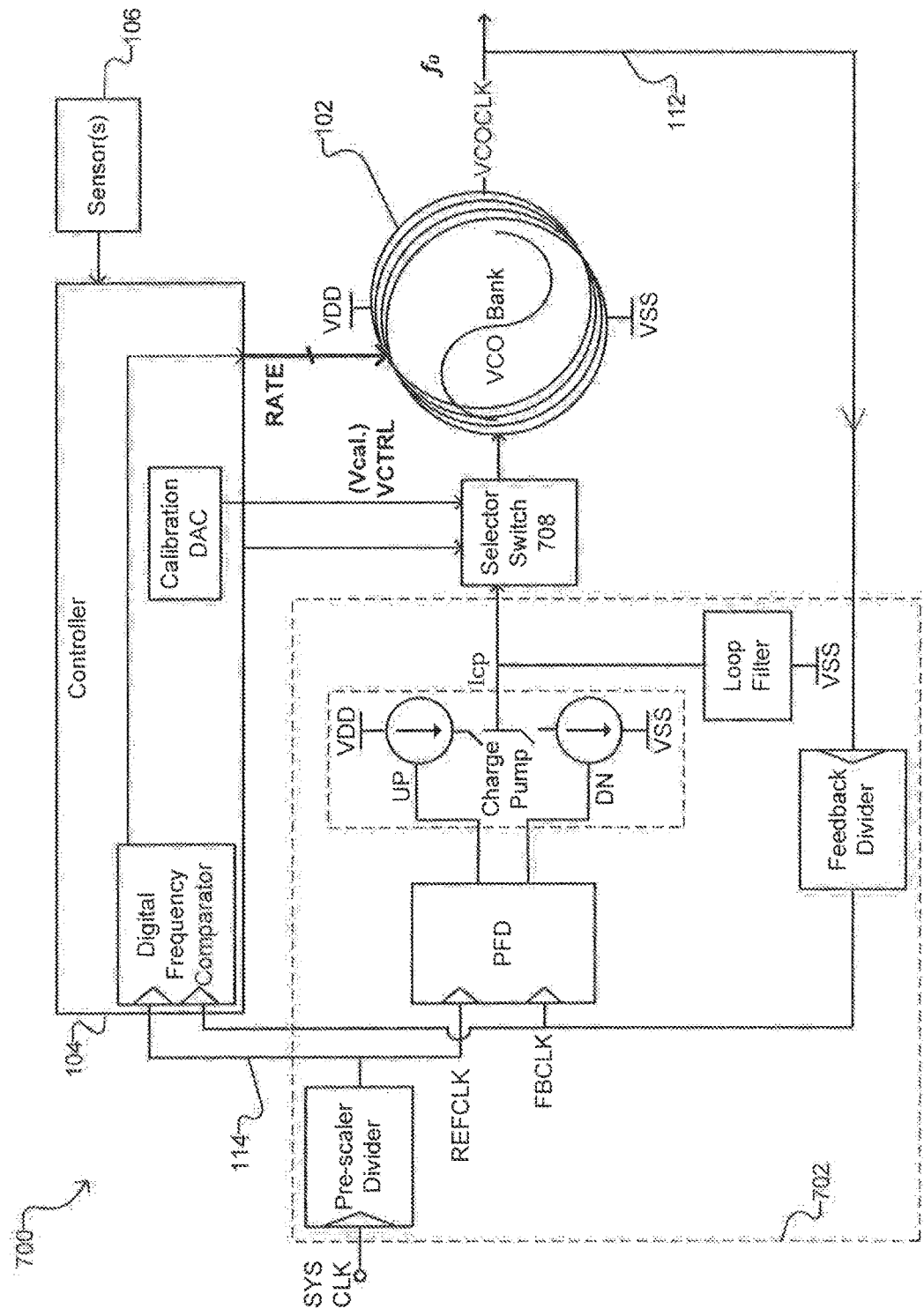
FIG. 14 is a more detailed block diagram of the PLL of FIG. 13 according to an embodiment of the present disclosure.

FIG. 14 is a more detailed block diagram of the PLL 700 according to an embodiment of the present disclosure. The controller 104 may comprise a digital frequency comparator and a calibration digital-to-analog converter (DAC). In other embodiments, the digital frequency comparator and/or the calibration DAC may be separate from the controller 104.

The PLL feedback circuit 702 may further comprise a prescaler divider, a phase/frequency detector (PFD), a charge pump, a loop filter, and a feedback divider.

The VCO 102 may further comprise a VCO bank comprising one or more LC VCOs. The VCO 102 has an input for receiving a fine-tuning control voltage and an input for receiving a coarse-tuning control RATE setting. The VCO 102 may have a plurality of selectable banks. The banks may be enabled via a SELECT input (not shown).

The one or more sensors 106 may sense operational conditions such as temperature, power supply voltage, and humidity that affect the VCO frequency.

In an embodiment, the prescaler divider receives a system clock signal SYSCLK and generates a reference clock signal REFCLK (i.e., a divided down version of the system clock SYSCLK), which is provided to both the PFD and the digital frequency comparator. The feedback divider receives the output signal VCOCLK from the VCO 102 and generates a feedback clock signal FBCLK (i.e., a divided down version of the output signal VCOCLK), which is provided to both the PFD and the digital frequency comparator. The PFD controls the charge pump based on the reference and feedback clock signals (REFCLK and FBCLK) to adjust a charge pump output current $I_{CP}$. The loop filter converts and the charge pump current $I_{CP}$ to the fine tuning control voltage $V_C$, which is provided to the VCO for generating the desired VCOCLK.

The selector switch of the PLL is controlled by the start-up calibration select signal 708 of the controller 104. Controlling the selector switch determines whether the controller 104 or the PLL feedback circuit 702 is coupled to the fine tuning control input of the VCO When the controller 104 is coupled to the line tuning control input of the VCO, the controller 104 can perform calibration methods, which may require sweeping the fine tuning control input of the VCO with all voltages within the operational range of the fine tuning control input. The controller 104 may generate the fine tuning control voltage internally, at an infernal DAC. Alternatively, the controller 104 may send a digital signal to a DAC located within the PLL feedback circuit 702 or located separately in the PLL system 700. The DAC will Interpret the digital signal from the controller 104 and generate an analog voltage corresponding to the fine tuning control voltage.

When the PLL feedback circuit 702 is coupled to the fine tuning control input of the VCO, the PLL feedback circuit can, through closed-loop feedback means, continuously adjust the fine tuning control voltage value in order to maintain the desired VCOCLK signal at the VCO output.

In the start-up calibration the controller 104 will calibrate the PLL 700 by configuring the coarse tuning control input with the appropriate RATE setting. The controller 104 may directly provide the RATE setting to the VCO 102 during the calibration mode. Alternatively, the controller 104 may provide a digital signal related to the RATE setting to the digital frequency comparator of the PLL feedback circuit 702, The digital frequency comparator may interpret the digital signal of the controller 104 and provide the corresponding RATE setting to the VCO 102.

The digital frequency comparator may comprise digital counters and a digital state machine arranged to compare the reference clock REFCLK to the feedback clock FBCLK. The digital state machine of digital frequency comparator 114 sweeps across the VCO's coarse capacitor settings, by adjusting the signal fed to coarse-tuning digital control input RATE to find the best value (called a calibrated setting) operates the VCO, when set at calibration control voltage $V_{cal}$ as close as possible to its target frequency, as defined by REFCLK.

After calibration, during the normal closed-loop PLL operation, the VCO 102 is configured to operate using the RATE setting chosen during calibration.

As indicated above, the calibration DAC generates the calibration voltage $V_{cal}$ applied to the VCO's fins-tuning control input (VCTRL), while charge pump output current $I_{CP}$ is turned off to force an open-loop VCO configuration. Amongst various DAC parameters such as speed, differential nonlinearity (DNL). Integral nonlinearity (INL), and least significant bit (LSB) resolution (i.e., full-scale range divided by $2^N$, where N is the number of DAC's input bits), only the latter two are Important for the calibration DAC. The INL and the quantization error due to finite LSB resolution (also known as resolution error) lead to an overall error on the DAC's output voltage compared to its ideal (intended) calibration value. This voltage error, $\Delta V_{DAC}$, multiplied by the VCO gain, $K_{VCO}$, translates to a DAC-induced VCO frequency error ($\Delta f_{DAC} = \Delta V_{DAC} K_{VCO}$). To minimize this error introduced in the VCO calibration, the DAC's INL and resolution errors combined should, in at least one embodiment, be small enough to make $\Delta f_{DAC}$ negligible compared to the VCO's coarse tuning frequency steps. On the other hand, the speed (also known as conversion rate) of the calibration DAC is not a critical parameter as the DAC practically operates at a DC condition during the calibration. Note that the DAC s dynamic range should, in at least one embodiment, cover at least the VCO's usable control voltage range of $V_{min} \leq V_C \leq V_{max}$.

In an example implementation, the calibration DAC comprises a 6-bit R-2R resistor ladder DAC that generates $2^6=64$ possible calibration voltage levels between 0 and $V_{DD}$ with integral nonlinearity (INL) of $\leq 0.5$ LSB, where 1 LSB equals to $V_{DD}/64$.

In some Implementations, multiple stagger-tuned VCOs may be employed in the VCO bank 102 to cover a wider tuning range, in which case a VCO selection signal, SELECT, (not shown) is generated by the controller 104, or by a look-up table, to select a proper VCO of the VCO bank 102 for the desired frequency range of operation before sweeping through the available settings for coarse-tuning control RATE to calibrate the selected VCO.

Once the selected VCO is calibrated, the signal fed to coarse-tuning control RATE and (optional) SELECT signal (not shown) are frozen, and the controller 104 places the PLL system 700 in a closed-loop state by enabling the charge pump and disabling the calibration DAG. In the closed loop state, the up and down control inputs (UP & DN) of the charge pump are driven by a 3-state phase/frequency detector (PFD) that receives the reference clock REFCLK and the feedback clock FBCLK at its inputs. The three states at the PFD output are up, down and off. The closed-loop control voltage $V_C$ is generated by the PFD and charge pump on to loop filter. The loop filter converts $I_{CP}$ to a low pass filtered: control voltage $V_C$. The closed-loop control voltage $V_C$ fine tunes the VCO to Keep it in frequency and phase lock with REFCLK. The loop filter may be co-integrated with the VCO on a semiconductor die of an integrated circuit (IC) device, assembled in the IC device package (a system-In-package, or SIP), or implemented externally on a printed circuit board (PCS).

Once the PLL system 700 comes out of the start-up calibration (open-loop) mode and enters the normal: (closed-loop) mode of operation, it goes through a transient state to acquire frequency and phase lock to the reference clock. When the transient state is settled to the locked state (and assuming operational conditions are unchanged from the calibration) the control voltage $V_C$ should ideally be, in at least one embodiment, the same as the calibration voltage $V_{cal}$. In practice, due to the quantization errors introduced in the calibration step, there can be an error on the settled control voltage $V_C$ compared to its ideal calibration value of $V_{cal}$. The main quantization error comes from the discrete steps of the capacitor bank selection in the coarse tuning calibration. The capacitance resolution is not infinite, hence the corresponding tuning: may be considered coarse. The coarse tuning settings, i.e. RATE and (optional) SELECT signals applied to the VCO bank 102, remain unchanged from the calibration, but this coarse setting does not necessarily set the ideal capacitor value suitable to generate an exact target frequency. Therefore, the closed-loop fine tuning control voltage $V_C$ will deviate from its calibrated value of $V_{cal}$ to adjust the VCO frequency to the target value. Another voltage error on $V_C$ may come from the calibration DAC, but can be minimized by proper choice of the DAC parameters (i.e., LSB resolution and INL) as explained earlier. In summary, immediately after the PLL is settled to its locked state and before any changes in operating conditions, there can be an error on the control voltage $V_C$ compared to its ideal calibration value of $V_{cal}$. This error eats into the tolerable margin of changes in post-calibration operating conditions. An improved calibration method according to the present disclosure can make use of the remaining margin by taking into account the calibration operating conditions.

As one skilled In the art will appreciate, the methods 200-600 described above for junction temperature calibration and power supply calibration can also be adapted for calibration based on moisture or on-die humidity.

In some embodiments, the VCO of a PLL system may be calibrated based on two or more operational conditions (e.g. junction temperature $T_j$ and power supply voltage $V_{DD}$) simultaneously.

Calibration according to the present disclosure allows a clock synthesizer unit (CSU), or a local oscillator (LO), with an LC-VCO-based PLL having coarse- and fine-tuning controls for the VCO to perform robustly over a wide range of temperature and/or power supply drift in post-calibration phase without a need to re-calibrate, or to increase the VCO gain at design time to increase its frequency tuning capability. By avoiding an unnecessary increase in the VCO gain, this technique helps improve the phase noise and jitter of a VCO/PLL by design. The calibration techniques can be applied on any VCO in development or already implemented that has coarse- and fine-tuning controls, in order to maximize the VCO's operational range and hence the PLL's locking range in post-calibration stress tests. These voltage and temperature (V&T) stress tests are generally used as part of device characterization procedures in a lab. They Include calibrating the VCO-under-test at one extreme corner of temperature and supply voltage (e.g. $T_{min}$=-40° C. and $VDD_{min}$) and initiating the PLL closed-loop operation, then gradually pushing the temperature and supply voltage to the opposite corner (e.g. $T_{max}$=125° C. and $VDD_{max}$) and observing the control voltage drift, locked status of the PLL and the phase jitter performance. Most modern CSUs for wireline SERDES applications and LOs for wireless RF applications can benefit from the present disclosure, as long as the VCO's die temperature and/or power supply voltage can be measured or: properly estimated. Some Implemented PLLs with conventional midrail-control-voltage VCO calibration have certain limitation on post-calibration temperature drift, $\Delta T$ (e.g., $\Delta T=\pm100°$ C.). However, by applying this calibration technique some such PLLs may achieve a post-calibration temperature drift of $\Delta T=\pm165°$ C. (i.e., a full-range drift from $-40°$ C. to 125° C., and vice versa). In addition, VCO calibration methods according to the present disclosure facilitate a lower VCO gain ($K_{VCO}$) to be used, thereby achieving lower oscillation phase noise and jitter.

By using calibration methods according to the present disclosure, one can approach the maximum achievable post-calibration tolerance against operational variations in a given VCO/PLL design. Achieving additional margin on control voltage over a conventional calibration method means a more "centered control voltage range" in post-calibration phase despite environmental or operational variations, which in turn translates to a more linear system operation: and an improved clock phase noise and jitter performance. Achieving additional margin on post-calibration control voltage over a conventional calibration method also means the VCO can tolerate additional long-term slow-down (or speed-up) effects, e.g. due to aging or extreme moisture sipping effects on the semiconductor die. Moisture loading of IC devices encompassing VCOs for production testing of such effects can be very time-consuming and costly.

Methods according to the present disclosure may make use of available temperature and/or power supply voltage information at run time, and a host of off-line characterization and optimization work, to provide a smart calibration voltage for the VCO in order to maximize the tolerable post-calibration operational variations. Operational variations include temperature drift, supply voltage drift, and possibly moisture loading.

Methods according to the present disclosure may be applied on any present VCO in development that has coarse- and fine-tuning controls to maximize VCO tuning range and hence PLL's locking range in post-calibration stress tests. Since the method is software/firmware-based, it can also be applied on implemented VCOs with similar architecture already in use on legacy products.

Methods according to the present disclosure may be applied at design time using simulation data to generate a matrix of polynomial coefficients, or numerical look-up tables. The polynomials or tables can be refined later, based on lab measurements and characterizations, if needed. Since in some embodiments the calibration method is software/firmware-based, this type of update is fairly straightforward and can be made in device revisions, or on clone devices when specifications are changed, or when porting a design to other semiconductor foundries or process technology nodes.

In the preceding description, for purposes of explanation, numerous details are set forth in order to provide a thorough understanding of the embodiments. However, it will be apparent to one skied in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

One or more electronic devices may be used in implementing one or more aspects or components of an embodiment according to the present disclosure. An electronic device may include one or more of a central processing unit or other type of electronic data processor, memory such as for example random access memory (RAM), a mass storage device, an input/output (I/O) interface, and a communications subsystem. One or more of the components or subsystems of the electronic device may be interconnected by way of one or more buses or in any other suitable manner.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CO-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to realize the described implementations can also be stored on the machine-readable medium. The instructions stored on the machine-readable medium can be executed by a processor or other suitable processing device, and can interface with circuitry to perform the described tasks.

The structure, features, accessories, and alternatives of specific embodiments described herein and shown in the Figures are intended to apply generally to all of the teachings of the present disclosure, including to ail of the embodiments described and illustrated herein, insofar as they are compatible. In other words, the structure, features, accessories, and alternatives of a specific embodiment are not intended to be limited to only that specific embodiment unless so indicated.

In addition, the steps and the ordering of the steps of methods described herein are not meant to be limiting. Methods comprising different steps, different number of steps, and/or different ordering of steps are also contemplated.

The above-described embodiments are intended to be examples only. Alterations, modifications and variations can be effected to the particular embodiments by those of skill in the art without departing from the scope of the present disclosure.

What is claimed is:

1. A method comprising:
    determining frequency control information relating to output frequency of a voltage-controlled oscillator (VCO), wherein:
        the VCO output frequency varies based on changes in one or more operational conditions; and
        the frequency control information enables indicating the VCO output frequency within a range of allowable values for one or more control inputs and a range of expected values based on the one or more operational conditions;
    for each of one or more control input settings, determining based on the frequency control information, calibration control information for determining a calibration voltage associated with at least one of the one or more control inputs, with respect to the one or more operational conditions, to generate a corresponding constant VCO output frequency;
    assessing the one or more operational conditions;
    determining, based on at least one of the one or more control inputs, a calibration voltage corresponding to the assessed one or more operational conditions;
    applying the calibration voltage;
    determining, based on applying the calibration voltage, a tuning control input for tuning the constant VCO output frequency; and
    applying the tuning control input to the VCO.

2. The method of claim 1, wherein the one or more operational conditions comprise a junction temperature of the VCO.

3. The method of claim 1, wherein the one or more operational conditions comprise a power supply voltage of the VCO.

4. The method of claim 1, wherein the one or more operational conditions comprise an on-die humidity of the VCO.

5. The method of claim 1, wherein the one or more operational conditions comprise a junction temperature of the VCO and a power supply voltage of the VCO.

6. The method of claim 1, wherein the one or more control inputs comprise a coarse-tuning control input and a fine-tuning control voltage input.

7. The method of claim 1, wherein the calibration control information comprises a polynomial function.

8. The method of claim 1, comprising generating the constant VCO output frequency such that the constant VCO output frequency is a midpoint of a usable VCO frequency range that comprises all VCO output frequencies that can be generated at a particular control input setting, over all of the range of expected values of the one or more operational conditions using only allowable values of a particular control input.

9. The method of claim 1, wherein tuning the constant VCO output frequency comprises minimizing a difference between the constant VCO output frequency and a target frequency.

10. The method of claim 1, wherein the voltage-controlled oscillator (VCO) of a phase-locked loop (PLL) system, and further comprising placing the PLL system in an open-loop state before applying the calibration voltage.

11. A system comprising:
    a voltage-controlled oscillator (VCO); and
    one or more circuits operable to:
        determine frequency control information relating to output frequency of the VCO, wherein:
            the VCO output frequency varies based on changes in one or more operational conditions; and
            the frequency control information enables indicating the VCO output frequency within a range of allowable values for one or more control inputs and a range of expected values based on the one or more operational conditions;
        for each of one or more control input settings, determine based on the frequency control information, calibration control information for determining a calibration voltage associated with at least one of the one or more control inputs, with respect to the one or more operational conditions, to generate a corresponding constant VCO output frequency;

assess the one or more operational conditions;
determine, based on at least one of the one or more control inputs, a calibration voltage corresponding to the assessed one or more operational conditions;
apply the calibration voltage;
determine, based on applying the calibration voltage, a tuning control input for tuning the constant VCO output frequency; and
apply the tuning control input to the VCO.

12. The system of claim 11, wherein the one or more operational conditions comprise a junction temperature of the VCO.

13. The system of claim 11, wherein the one or more operational conditions comprise a power supply voltage of the VCO.

14. The system of claim 11, wherein the one or more operational conditions comprise an on-die humidity of the VCO.

15. The system of claim 11, wherein the one or more operational conditions comprise a junction temperature of the VCO and a power supply voltage of the VCO.

16. The system of claim 11, wherein the one or more control inputs comprise a coarse-tuning control input and a fine-tuning control voltage input.

17. The system of claim 11, wherein the calibration control information comprises a polynomial function.

18. The system of claim 11, wherein the one or more circuits are operable to control the VCO such that the constant VCO output frequency is a midpoint of a usable VCO frequency range that comprises all VCO output frequencies that can be generated at a particular control input setting, over all of the range of expected values of the one or more operational conditions using only allowable values of a particular control input.

19. The system of claim 11, wherein the one or more circuits are operable to minimize a difference between the constant VCO output frequency and a target frequency when tuning the constant VCO output frequency.

20. The system of claim 11, wherein:
the voltage-controlled oscillator (VCO) is associated with a phase-locked loop (PLL); and
the one or more circuits are operable to place the PLL in an open-loop state before applying the calibration voltage.

* * * * *